United States Patent
Wen et al.

(10) Patent No.: US 12,402,354 B2
(45) Date of Patent: Aug. 26, 2025

(54) EPITAXIAL FEATURES IN SEMICONDUCTOR DEVICES AND MANUFACTURING METHOD OF THE SAME

(71) Applicant: TAIWAN SEMICONDUCTOR MANUFACTURING COMPANY, LTD., Hsinchu (TW)

(72) Inventors: Chung-Chi Wen, Taipei (TW); Yen-Ting Chen, Taichung (TW); Wei-Yang Lee, Taipei (TW); Chih-Chiang Chang, Hsinchu County (TW); Chien-I Kuo, Chiayi County (TW); Chia-Pin Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 492 days.

(21) Appl. No.: 17/832,609

(22) Filed: Jun. 4, 2022

(65) Prior Publication Data
US 2023/0163186 A1   May 25, 2023

Related U.S. Application Data

(60) Provisional application No. 63/281,782, filed on Nov. 22, 2021.

(51) Int. Cl.
*H01L 21/02* (2006.01)
*H10D 30/67* (2025.01)
(Continued)

(52) U.S. Cl.
CPC ..... *H10D 30/6735* (2025.01); *H10D 30/6757* (2025.01); *H10D 62/121* (2025.01);
(Continued)

(58) Field of Classification Search
CPC .......... H01L 29/42392; H01L 29/0673; H01L 29/41775; H01L 29/66545;
(Continued)

(56) References Cited

U.S. PATENT DOCUMENTS 8,772,109 B2   7/2014   Colinge
8,785,285 B2   7/2014   Tsai et al.
(Continued)

*Primary Examiner* — Samuel Park
(74) *Attorney, Agent, or Firm* — HAYNES AND BOONE, LLP

(57) ABSTRACT

A method includes forming a semiconductor fin protruding from a substrate, forming a dummy gate structure across the semiconductor fin, recessing a portion of the semiconductor fin in a region adjacent the dummy gate structure to form a recess, growing a semiconductor layer in the recess, and forming a first dielectric layer interposing the semiconductor layer and the dummy gate structure. The semiconductor layer covers at least a portion of the first dielectric layer. The method also includes modifying a shape of the semiconductor layer to expose the portion of the first dielectric layer, depositing a second dielectric layer covering the semiconductor layer and the portion of the first dielectric layer, and replacing the dummy gate structure with a metal gate structure.

20 Claims, 32 Drawing Sheets

(51) Int. Cl.
*H10D 62/10* (2025.01)
*H10D 64/01* (2025.01)
*H10D 64/23* (2025.01)

(52) U.S. Cl.
CPC ......... *H10D 64/017* (2025.01); *H10D 64/018* (2025.01); *H10D 64/258* (2025.01)

(58) Field of Classification Search
CPC ......... H01L 29/66553; H01L 29/78696; H01L 29/41725; H01L 29/66439; H01L 29/161; H01L 29/165; H01L 29/785; H01L 29/0847; H01L 29/775; H01L 29/7848; B82Y 10/00
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2017/0103986 A1 | 4/2017 | Kim et al. |
| 2018/0151703 A1* | 5/2018 | Lin ....................... H01L 29/161 |
| 2020/0105609 A1* | 4/2020 | Wang ............. H01L 21/823431 |

* cited by examiner

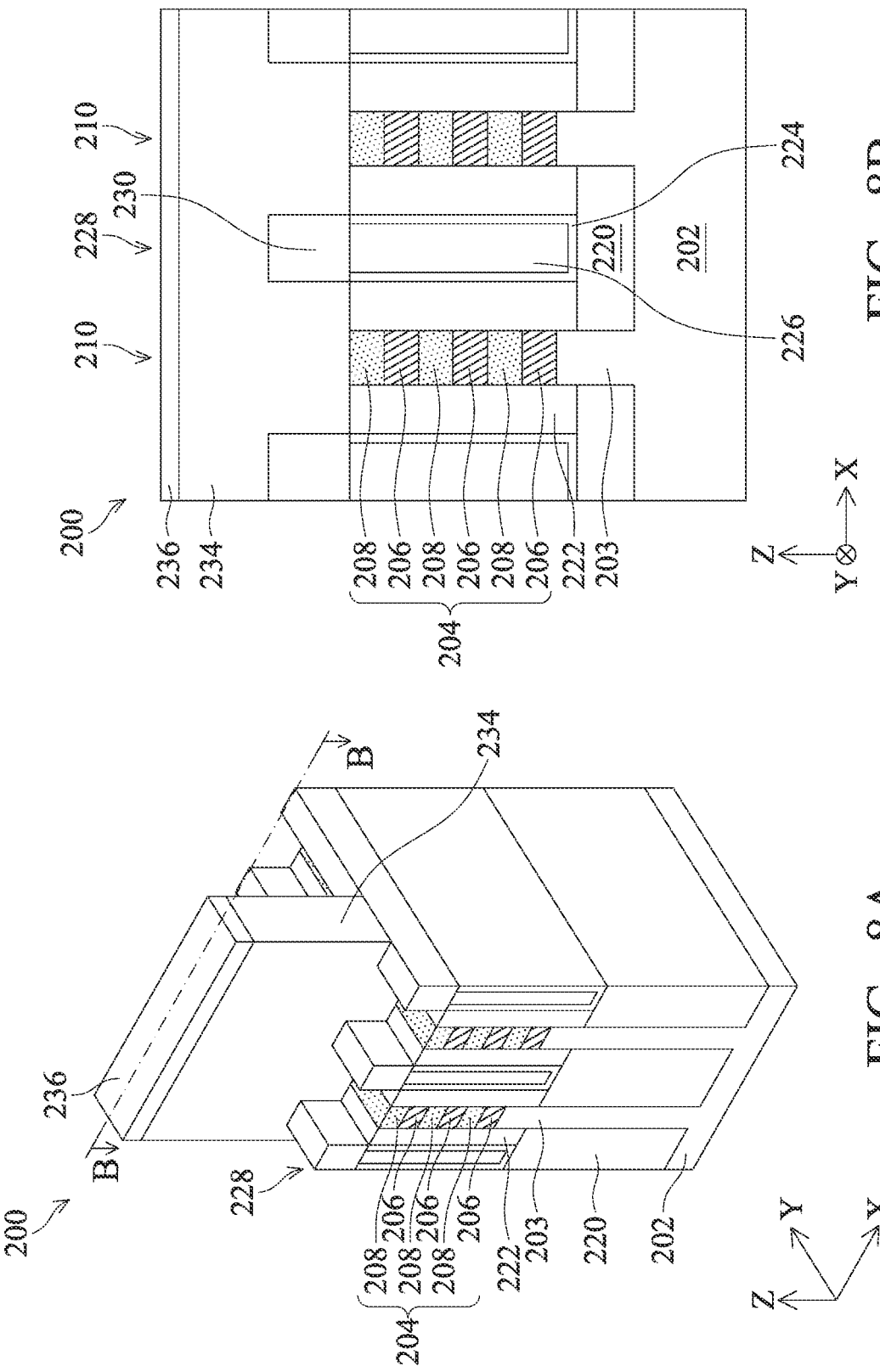

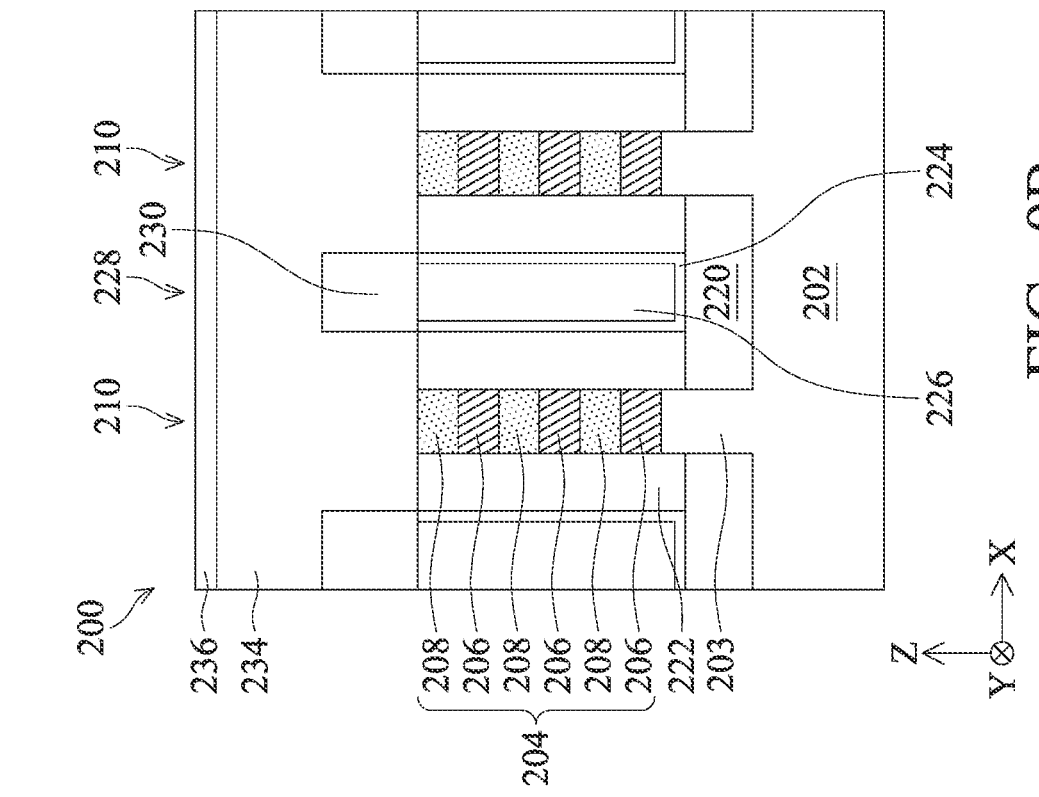
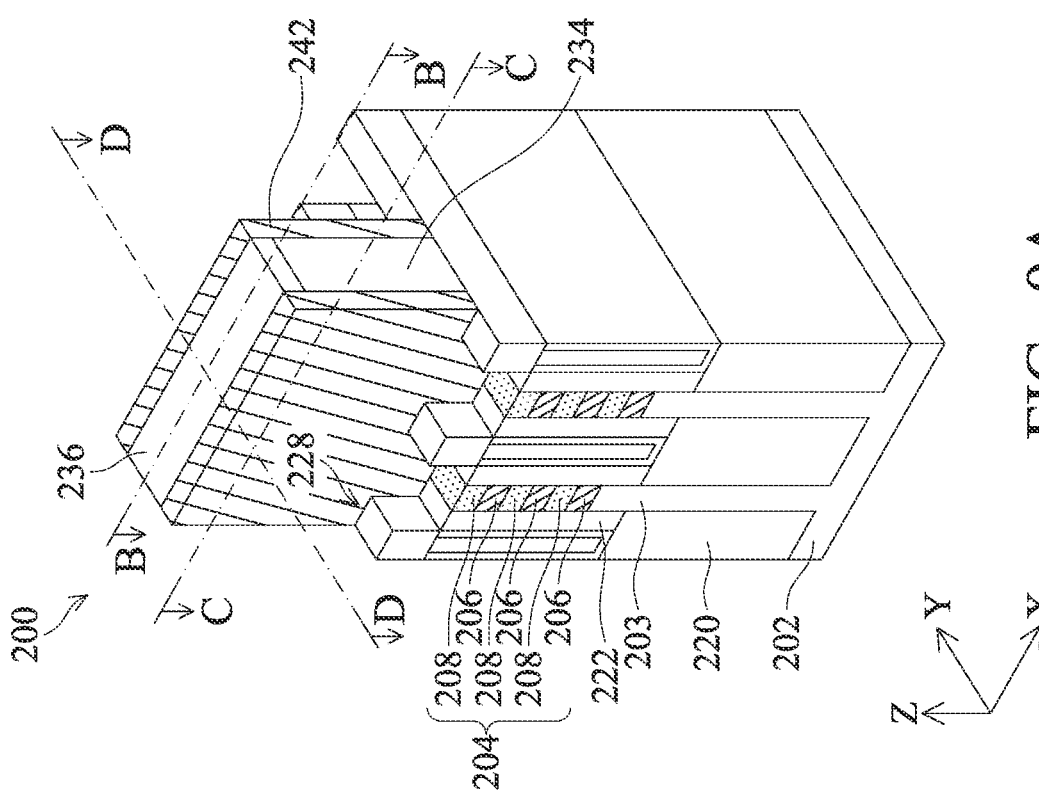
FIG. 9A
FIG. 9B

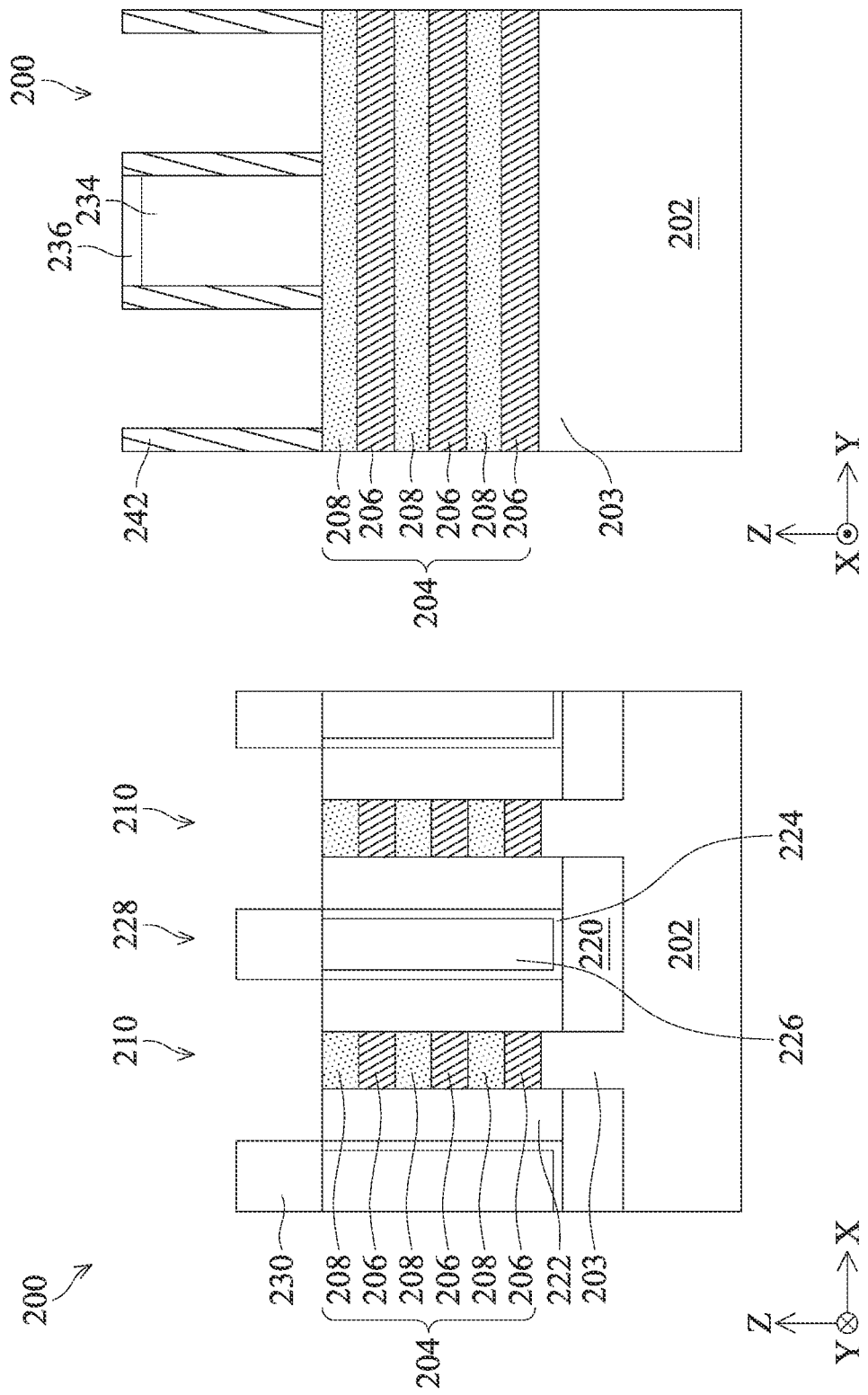

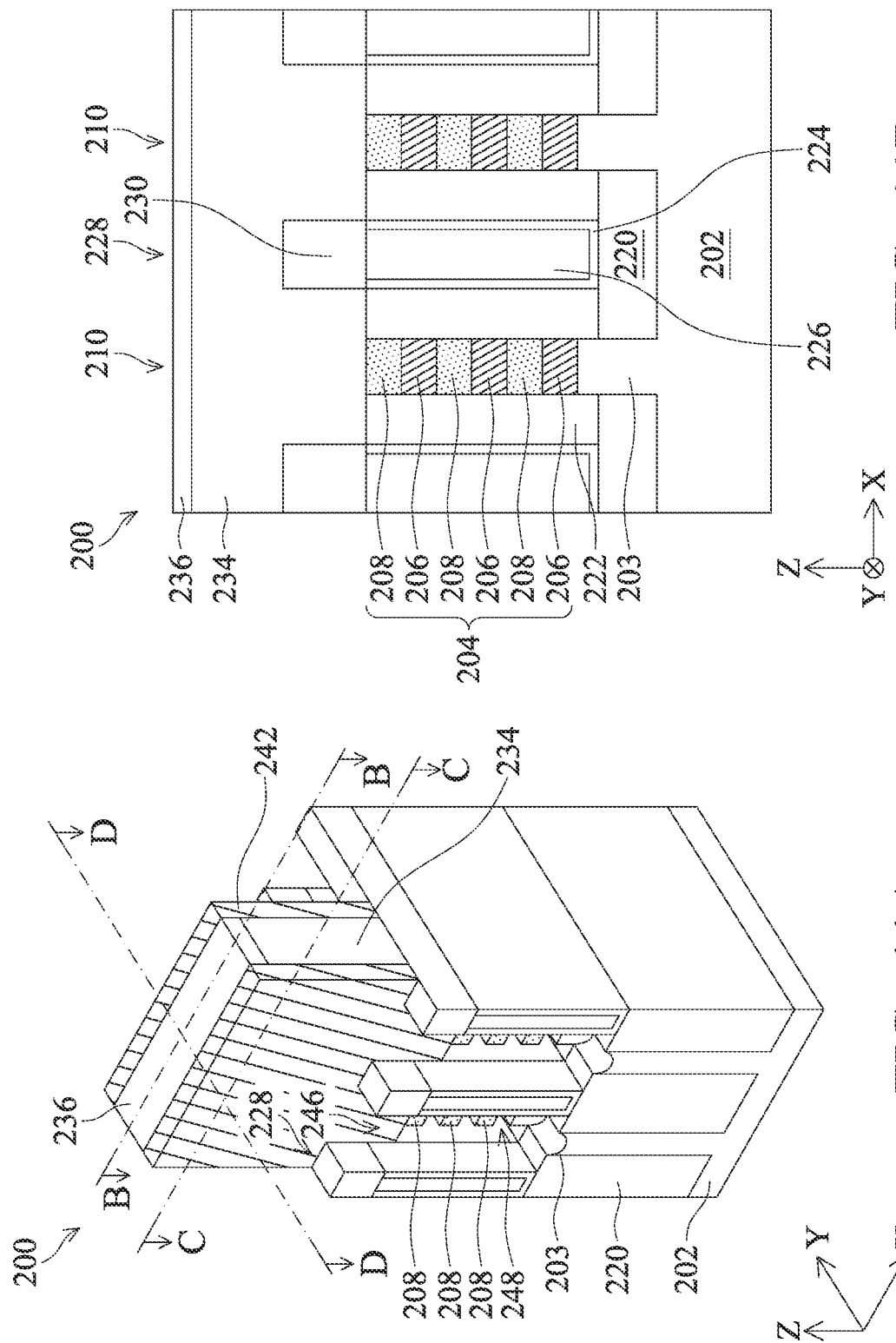

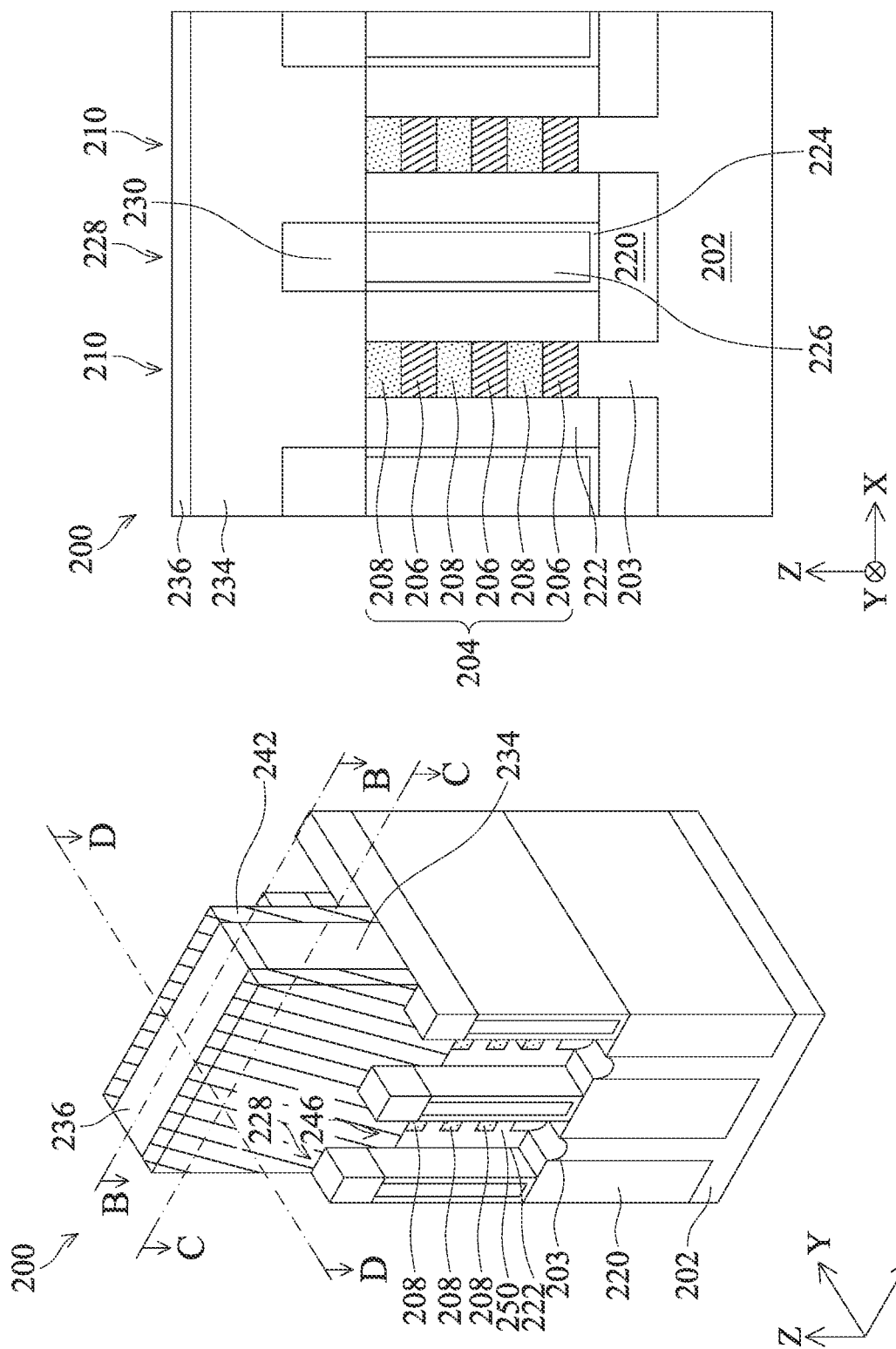

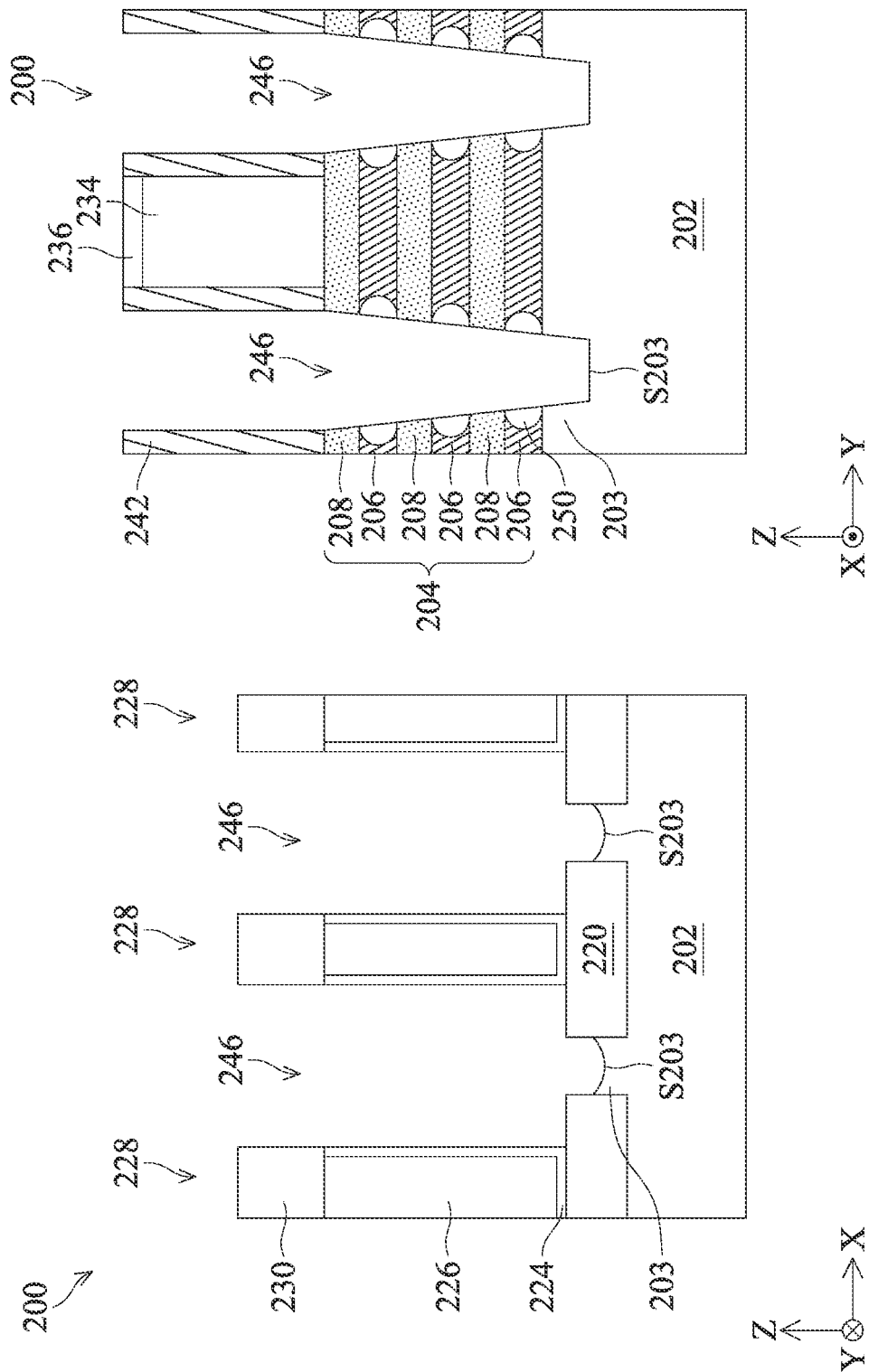

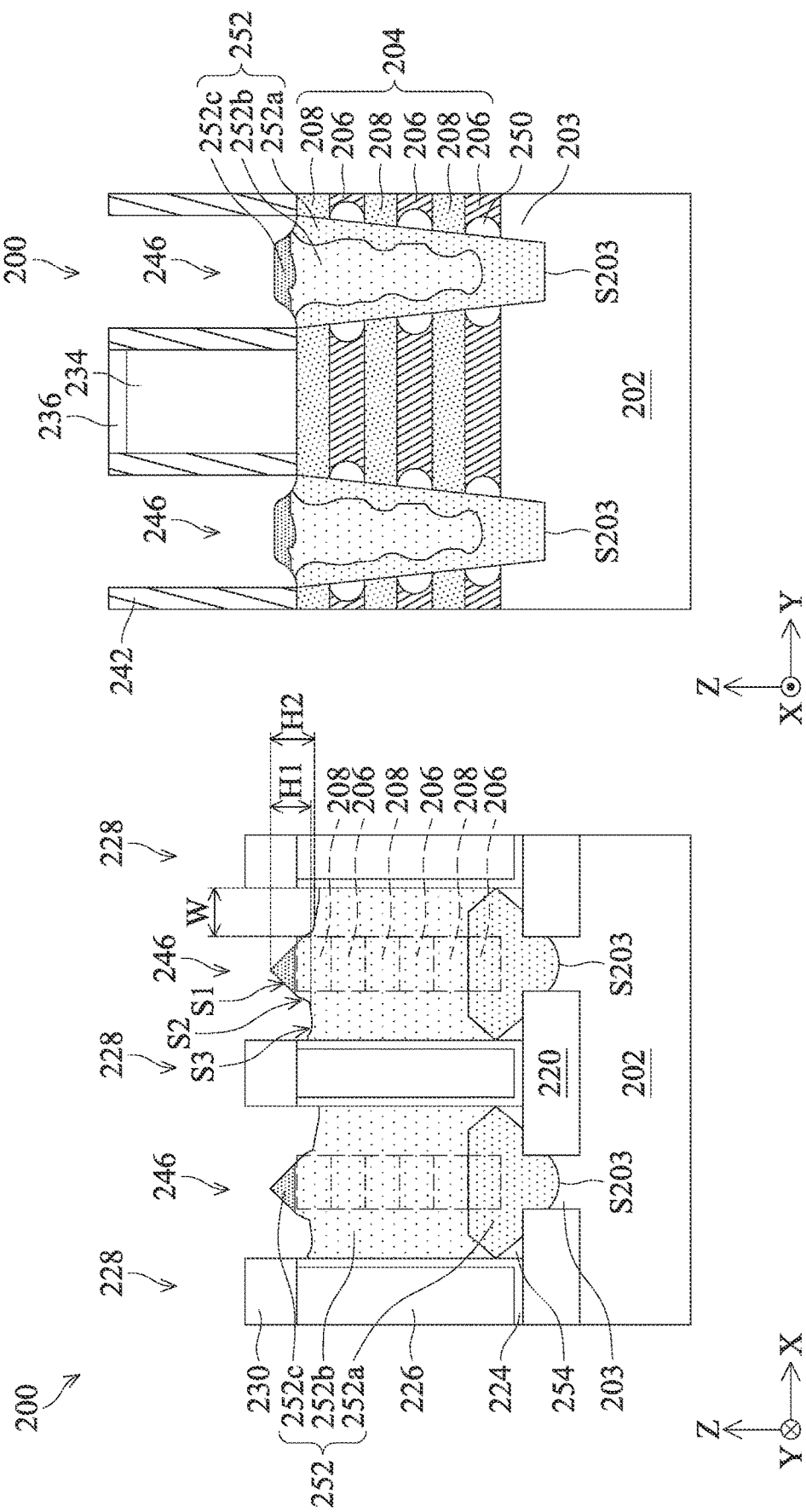

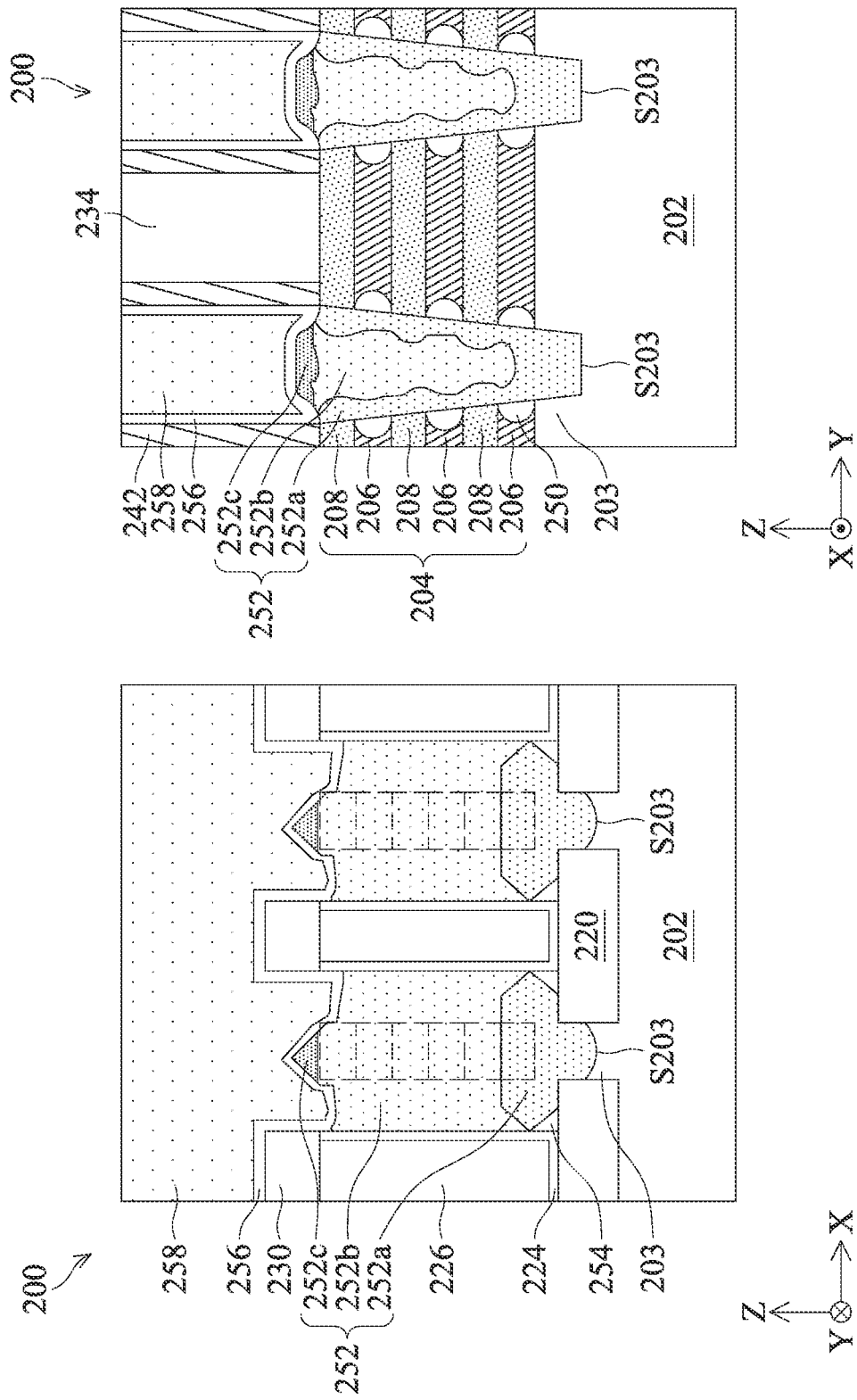

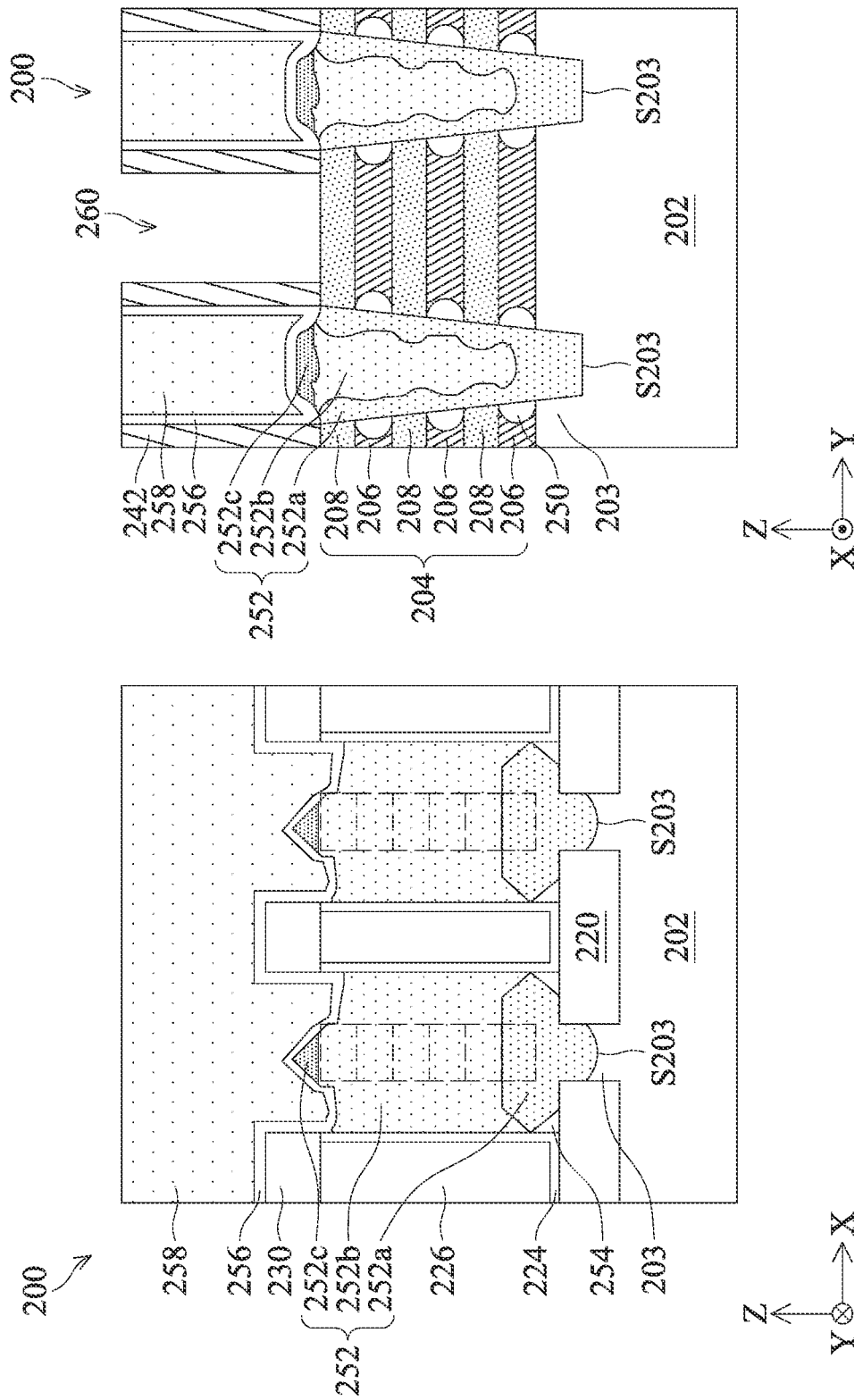

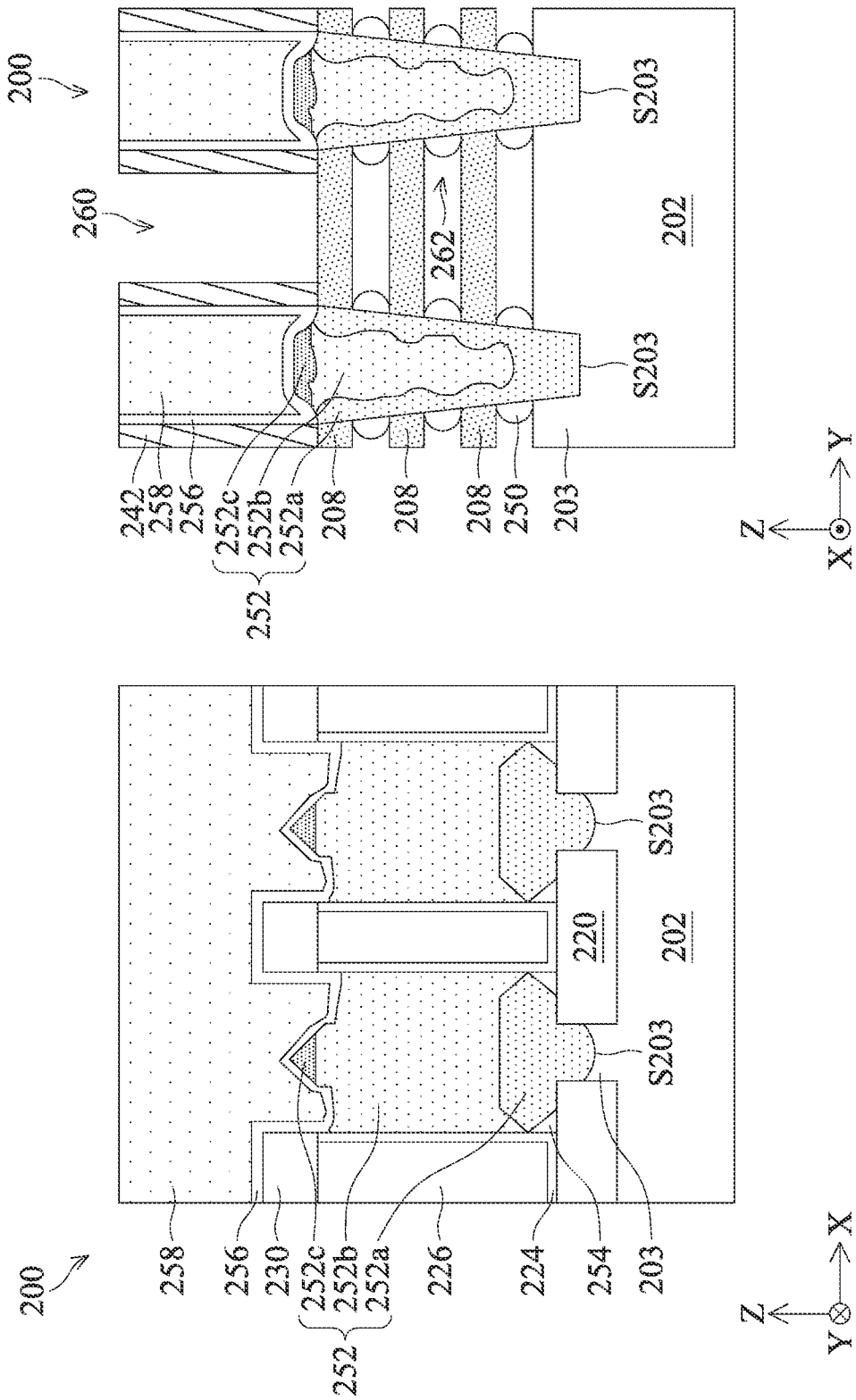

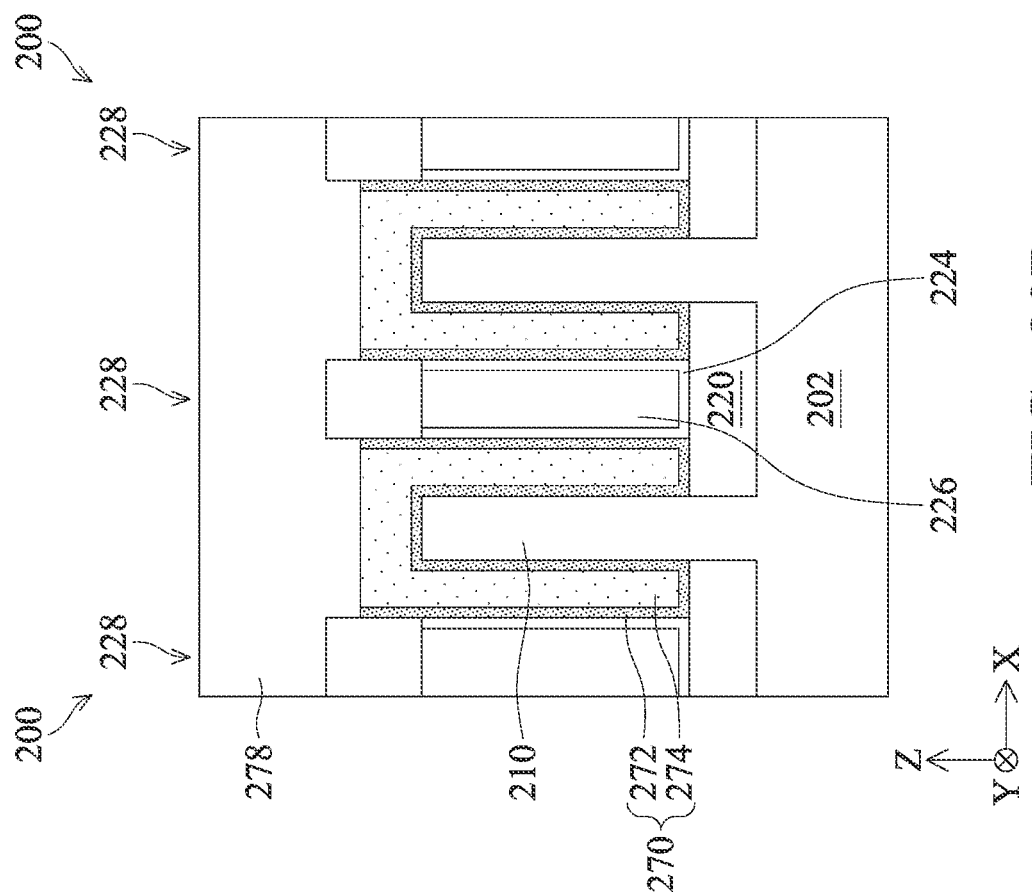
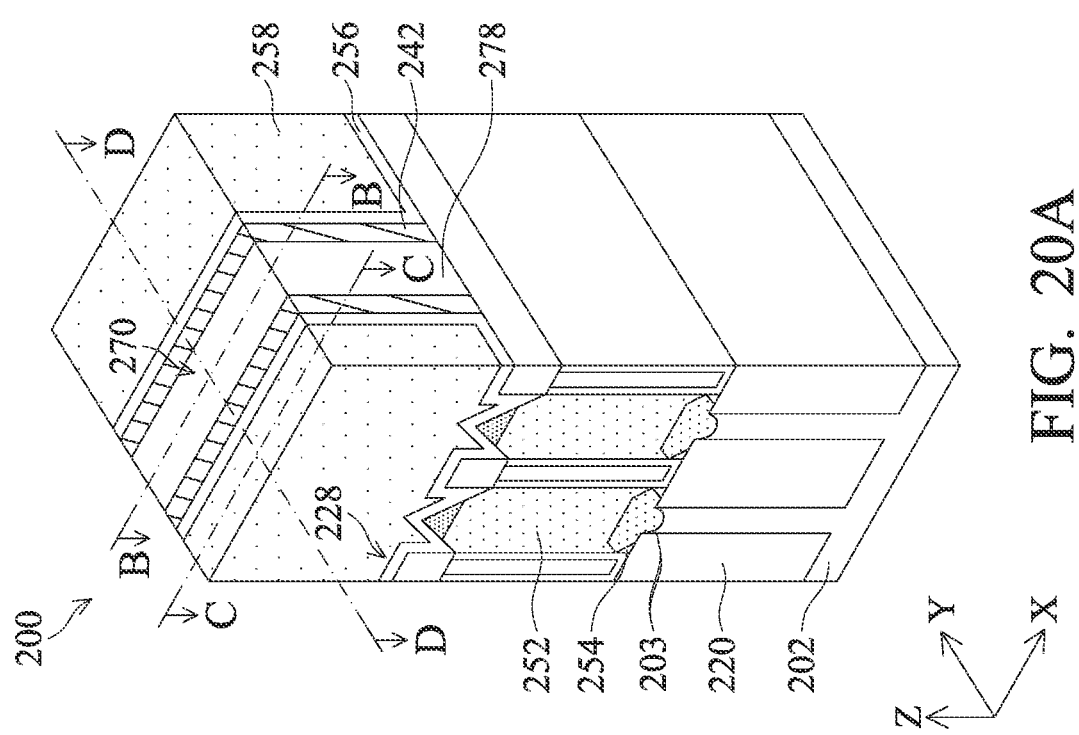
FIG. 20A
FIG. 20B

EPITAXIAL FEATURES IN SEMICONDUCTOR DEVICES AND MANUFACTURING METHOD OF THE SAME

PRIORITY DATA

This application claims priority to U.S. Provisional Patent Application No. 63/281,782 filed on Nov. 22, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which can extend around the channel region providing access to the channel on four sides. GAA devices are compatible with conventional complementary metal-oxide-semiconductor (CMOS) processes and their structure allows them to be aggressively scaled while maintaining gate control and mitigating SCEs.

To continue to provide the desired scaling and increased density for multi-gate devices (e.g., FinFETs and GAA devices) in advanced technology nodes, dielectric fins have been introduced to improve the uniformity of fins (including semiconductor fins and dielectric fins) and define space for source/drain (S/D) epitaxial features. Sacrificial cladding layers comprising semiconductor materials may also be introduced to fill between semiconductor fins and dielectric fins to reserve space for metal gate stacks in a replacement gate process. The sacrificial cladding layer increases spacing between adjacent dielectric fins and consequently leads to a larger volume of S/D epitaxial features grown between the dielectric fins. The larger volume of S/D epitaxial features may cause high parasitic capacitance between S/D contacts and metal gate stacks. The larger volume of S/D epitaxial features also deteriorates leakage performance between S/D contacts and metal gate stacks. Therefore, while the current methods have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, 17A, 18A, and 20A illustrate perspective views of a semiconductor structure during a fabrication process according to the method of FIGS. 1A and 1B, according to aspects of the present disclosure.

FIGS. 2B, 3B, 4B, 5B, 6B, 7B, 8B, 9B, 9C, 9D, 10B, 10C, 10D, 11B, 11C, 11D, 12B, 12C, 12D, 13B, 13C, 13D, 14B, 14C, 14D, 15B, 15C, 15D, 16B, 16C, 16D, 17B, 17C, 17D, 18B, 18C, 18D, 19, 20B, 20C, and 20D illustrate cross-sectional views of a semiconductor structure during a fabrication process according to the method of FIGS. 1A and 1B, according to aspects of the present disclosure.

DETAILED DESCRIPTION

Figure 1A:
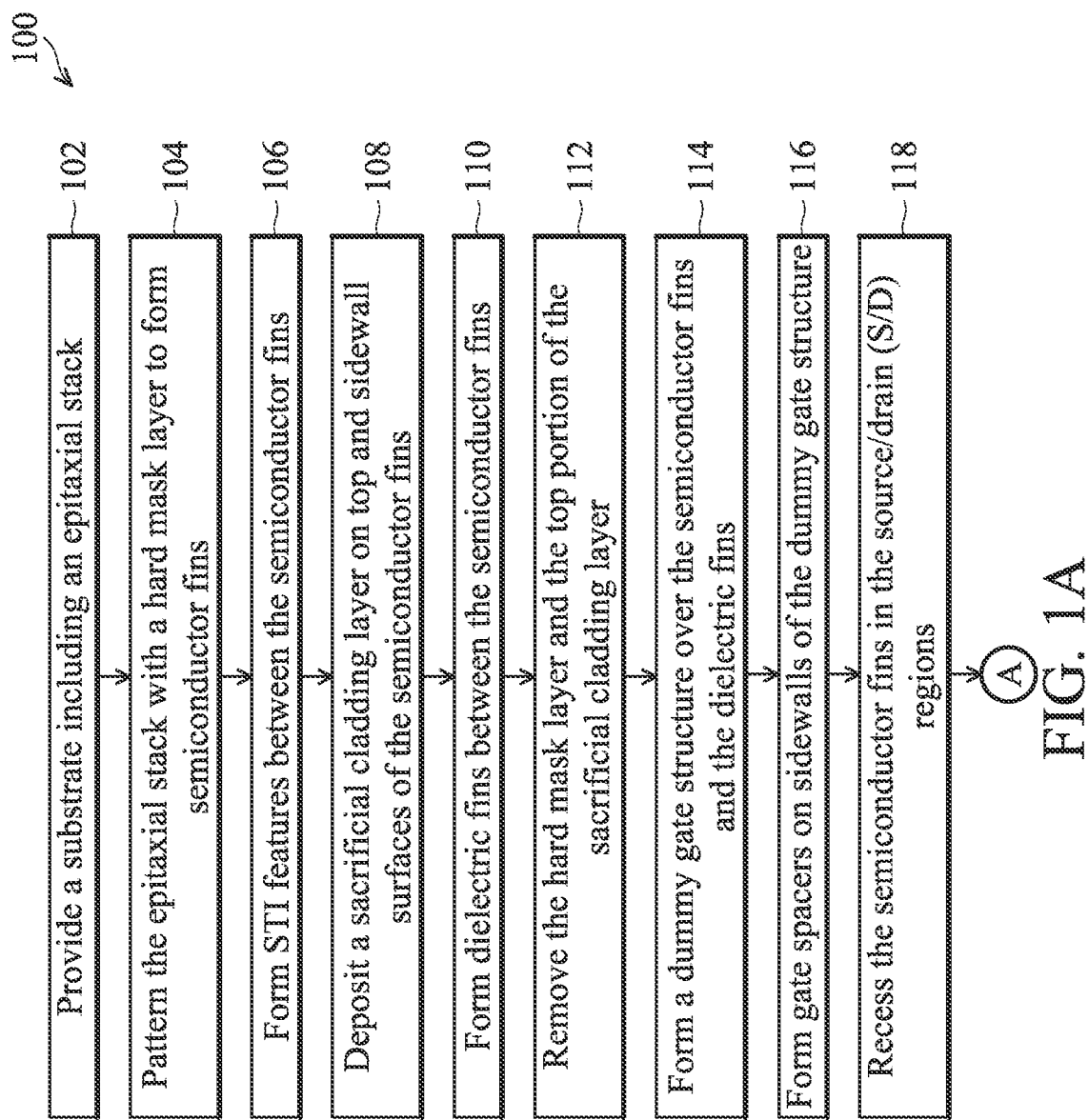
FIGS. 1A and 1B show a flow chart of a method for forming a multi-gate device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating multi-gate devices with reshaped source/drain (S/D) epitaxial features in advanced technology nodes. It is noted that multi-gate devices include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing dielectric fins for improving fin uniformity and defining space for S/D epitaxial features, and a sacrificial cladding layer with semiconductor material for reserving space for metal gate stacks. The existence of the sacrificial cladding layer increases spacing between adjacent dielectric fins and consequently leads to larger volume of S/D epitaxial features. Even though the sacrificial cladding layer is subsequently replaced by an inner spacer layer as an isolation between S/D epitaxial features and metal gate stacks, the increased volume of S/D epitaxial features still increases parasitic capacitance between S/D contacts and metal gate stacks. Embodiments discussed herein includes reshaping S/D epitaxial features to modify the profile of the S/D epitaxial features. By reshaping S/D epitaxial features, the volume of S/D epitaxial features is reduced, thus less parasitic capacitance. Further, the reshaped profile of S/D epitaxial features helps suppressing leakage current between S/D contacts and metal gate stacks and improves device performance.

Figure 1B:
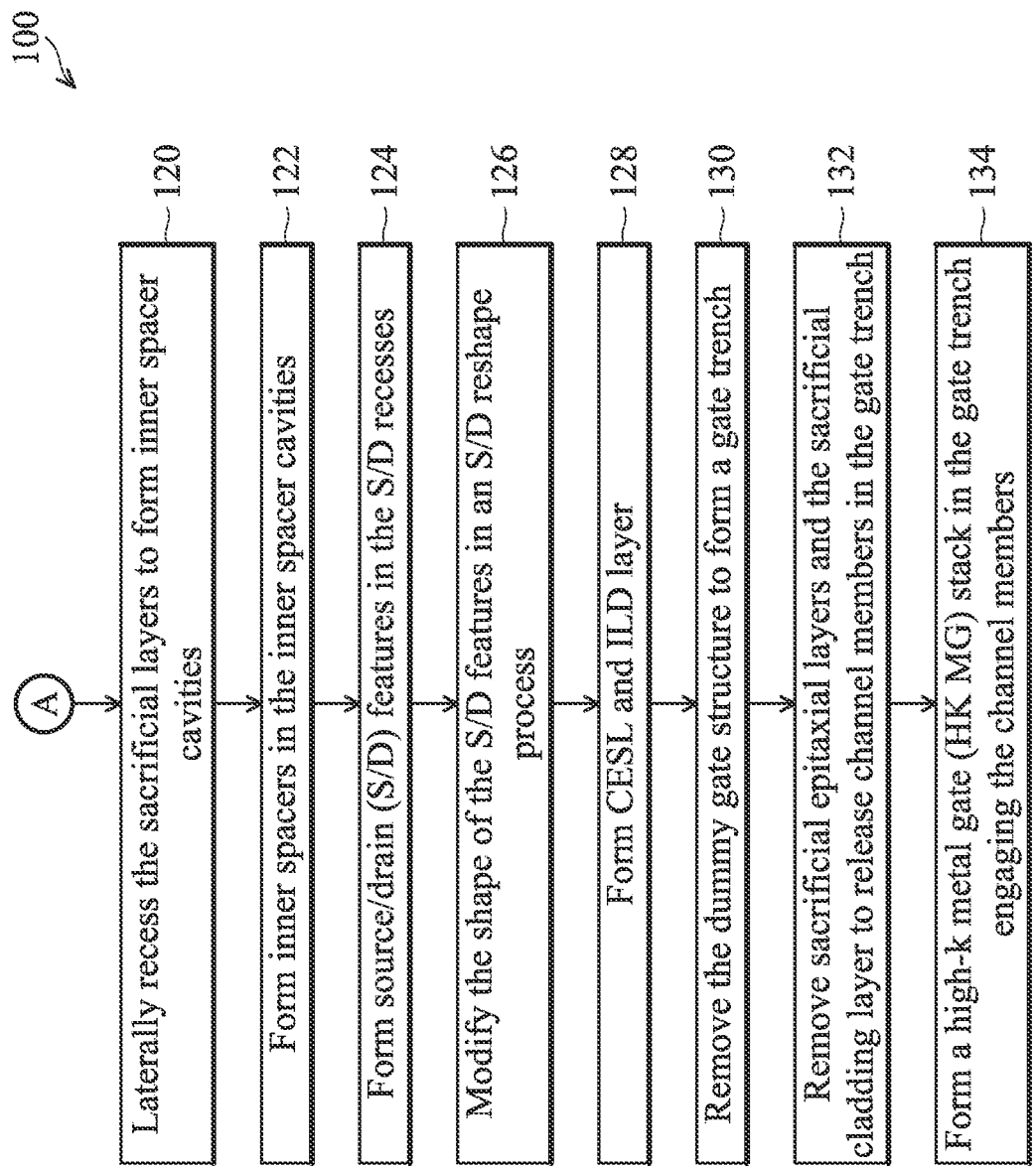
Figure 18B:
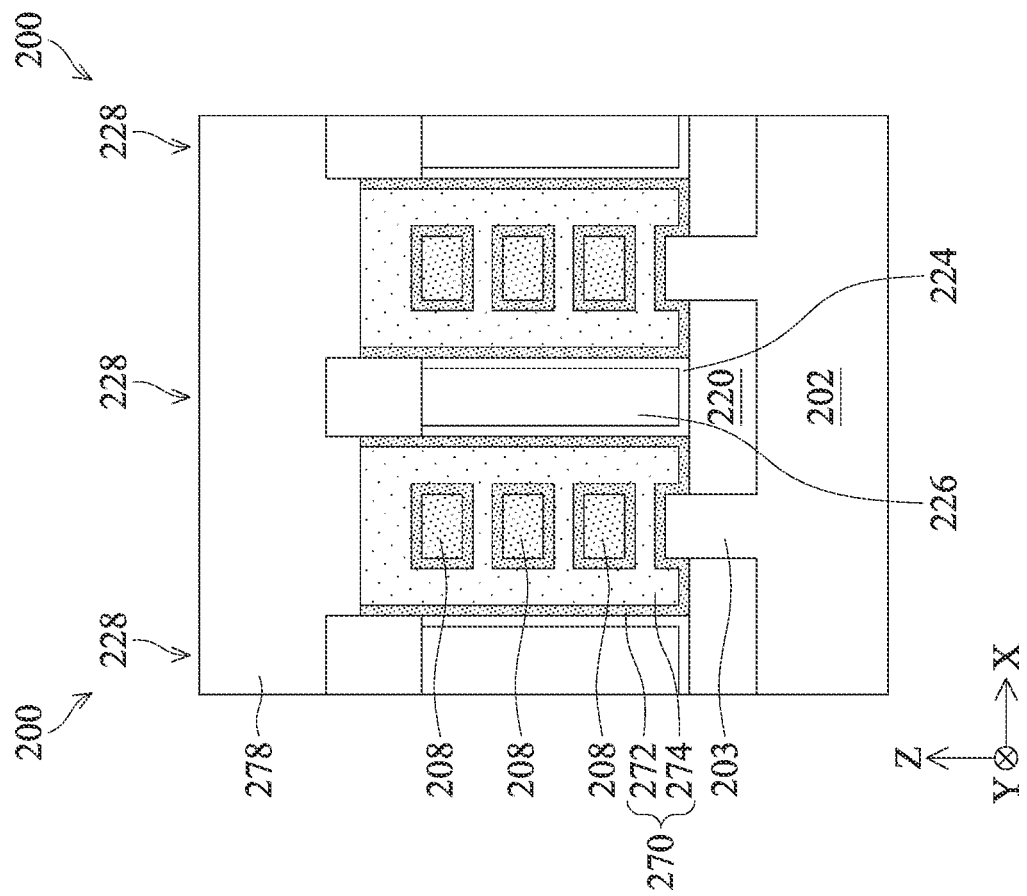
Figure 18A:
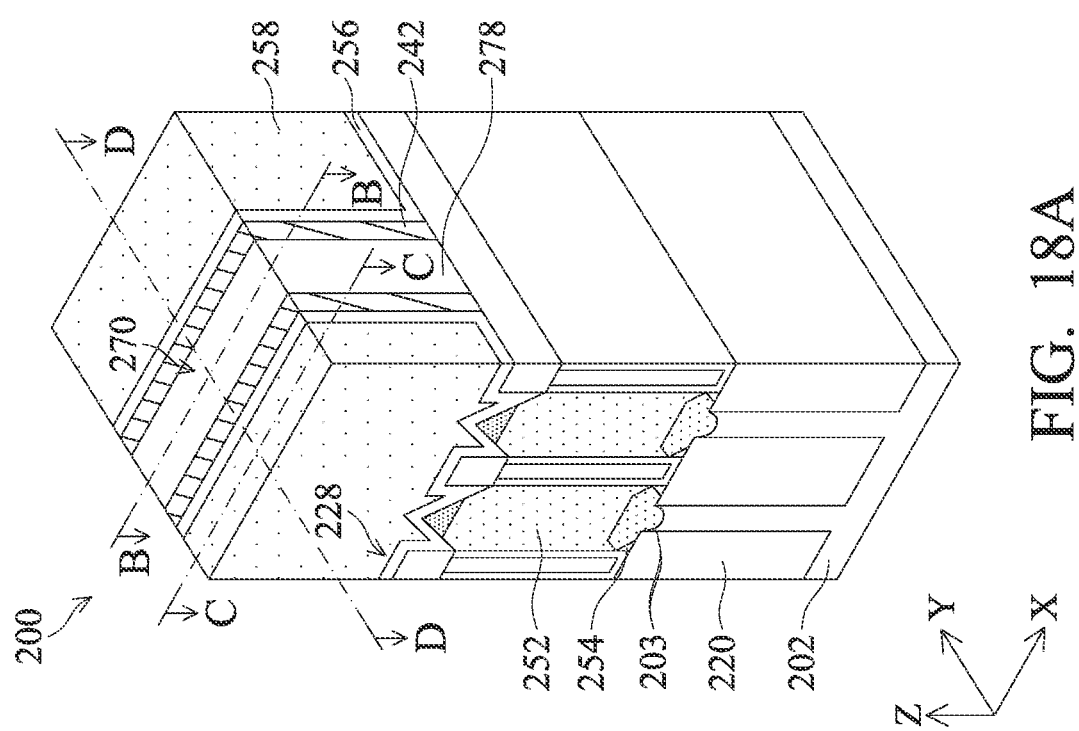
Figures 18C, 18D:
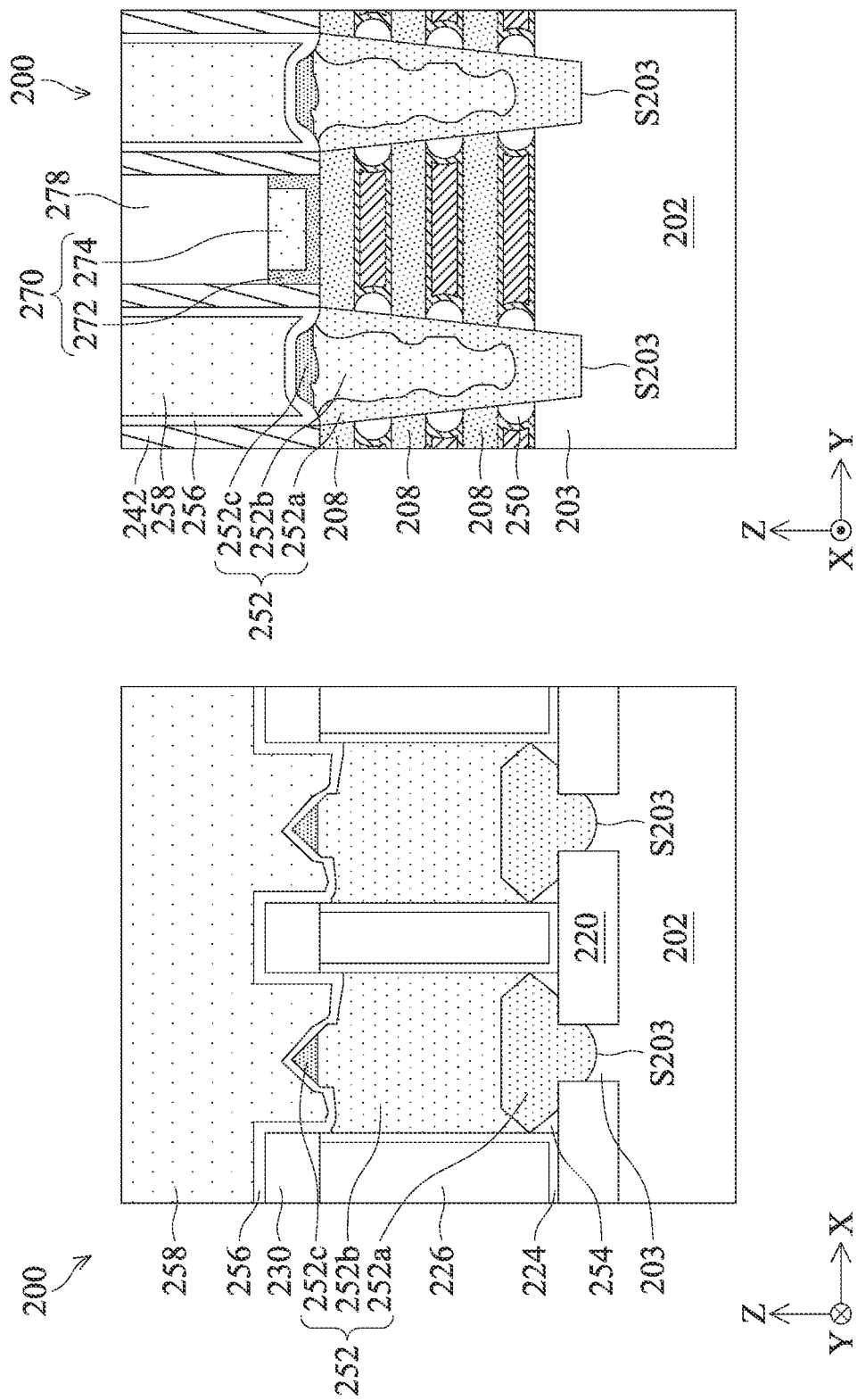
Figure 19:
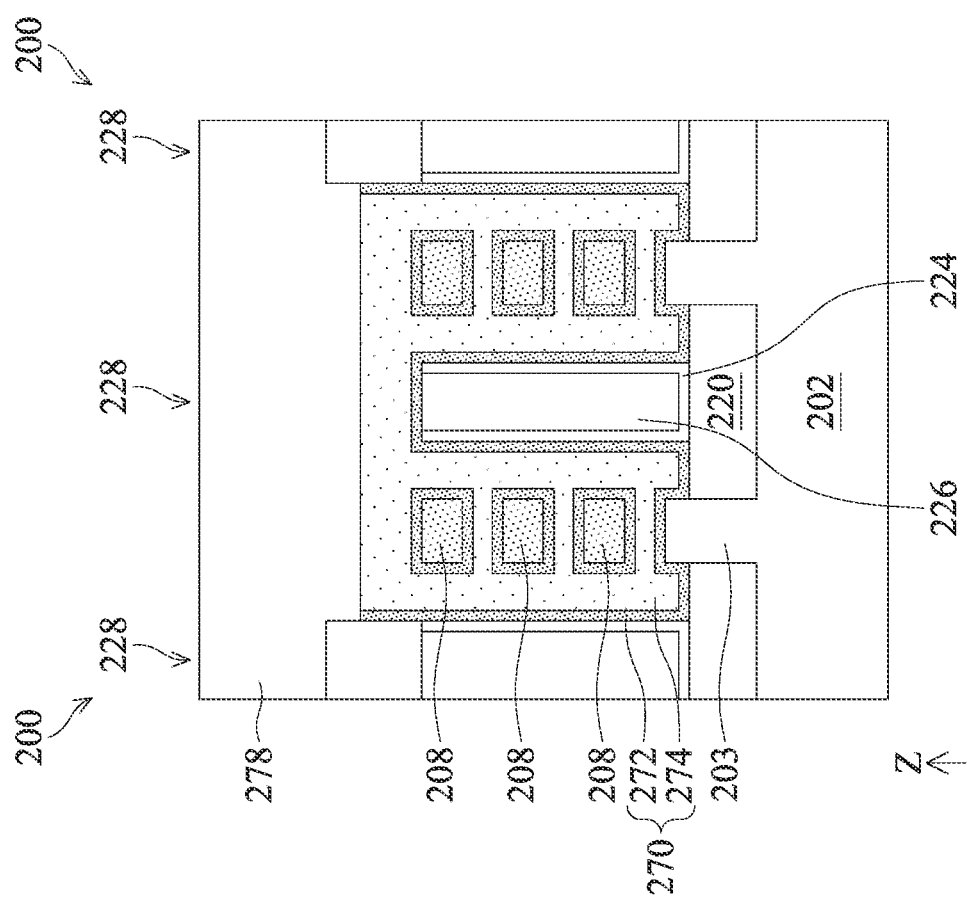
Figure 20D:
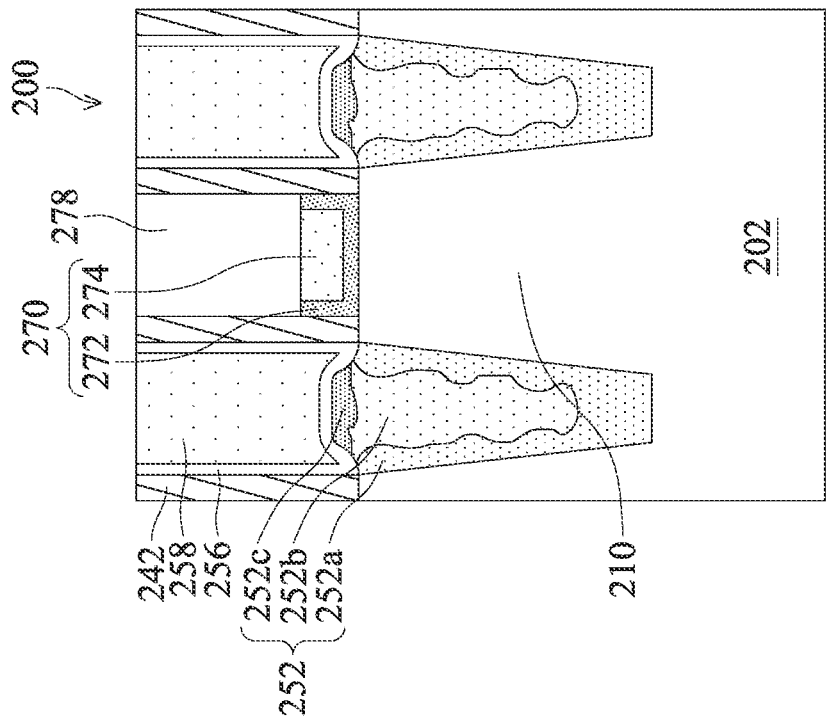
Figure 20C:
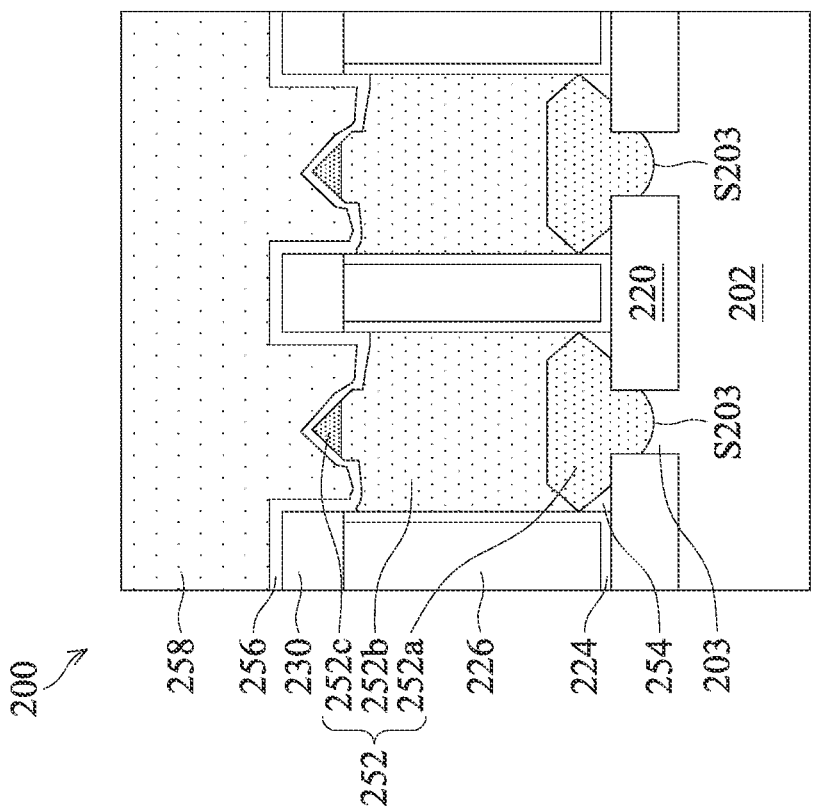

Illustrated in FIGS. 1A and 1B is a method 100 of semiconductor fabrication including fabrication of multi-gate devices. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-20D. FIGS. 2A, 3A, 4A, 5A, 6A, 7A, 8A, 9A, 10A, 11A, 12A, 13A, 14A, 15A, 16A, 17A, 18A, and 20A represent perspective views of an embodiment of a semiconductor device 200 according to various stages of the method 100 of FIGS. 1A and 1B. FIGS. 2B, 3B, 4B, 5B, 6B, 7B, 8B, 9B, 10B, 11B, 12B, 13B, 14B, 15B, 16B, 17B, 18B, and 20B are cross-sectional views taken in the X-Z plane along the B-B line in the corresponding figures numbered with suffix "A", which cut through a gate region and perpendicular to a lengthwise direction of a channel region of the to-be-formed multi-gate device. FIGS. 9C, 10C, 11C, 12C, 13C, 14C, 15C, 16C, 17C, 18C, and 20C are cross-sectional views taken in the X-Z plane along the C-C line in the corresponding figures numbered with suffix "A", which cut through a gate region and perpendicular to a lengthwise direction of a channel region of the to-be-formed multi-gate device. FIGS. 9D, 10D, 11D, 12D, 13D, 14D, 15D, 16D, 17D, 18D, and 20D are cross-sectional views taken in the Y-Z plane along the D-D line in the corresponding figures numbered with suffix "A", which cut through a channel region and adjacent source/drain regions of the to-be-formed multi-gate device. FIG. 19 is an alternative cross-sectional view taken in the X-Z plane along the B-B line in FIG. 18A, which cut through a gate region and perpendicular to a lengthwise direction of a channel region of the to-be-formed multi-gate device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including P-FETs, N-FETs, etc., which may be interconnected. Moreover, it is noted that the process steps of method 100, including any descriptions given with reference to FIGS. 2-20D, as with the remainder of the method and exemplary figures provided in this disclosure, are merely exemplary and are not intended to be limiting beyond what is specifically recited in the claims that follow.

Figure 2B:
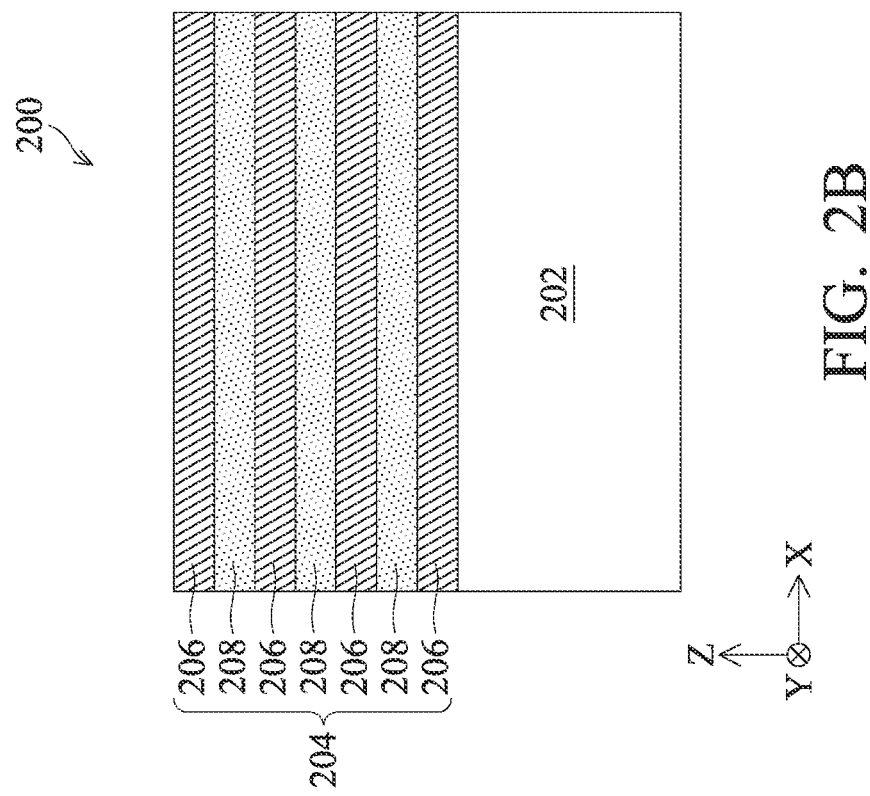
Figure 2A:
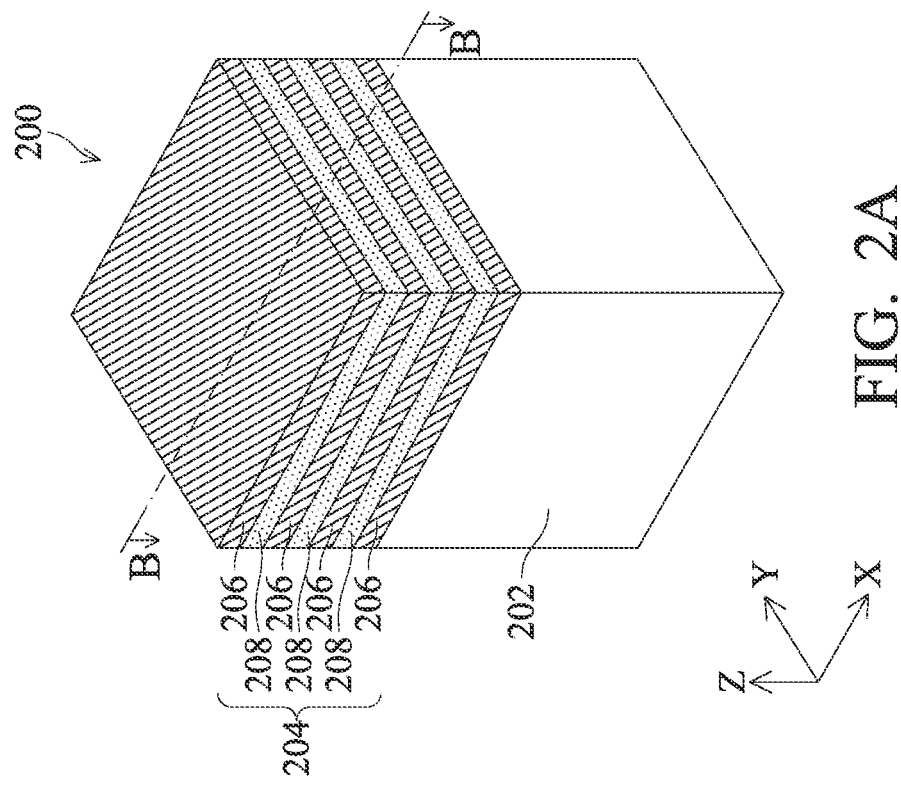
Figures 3A, 3B:
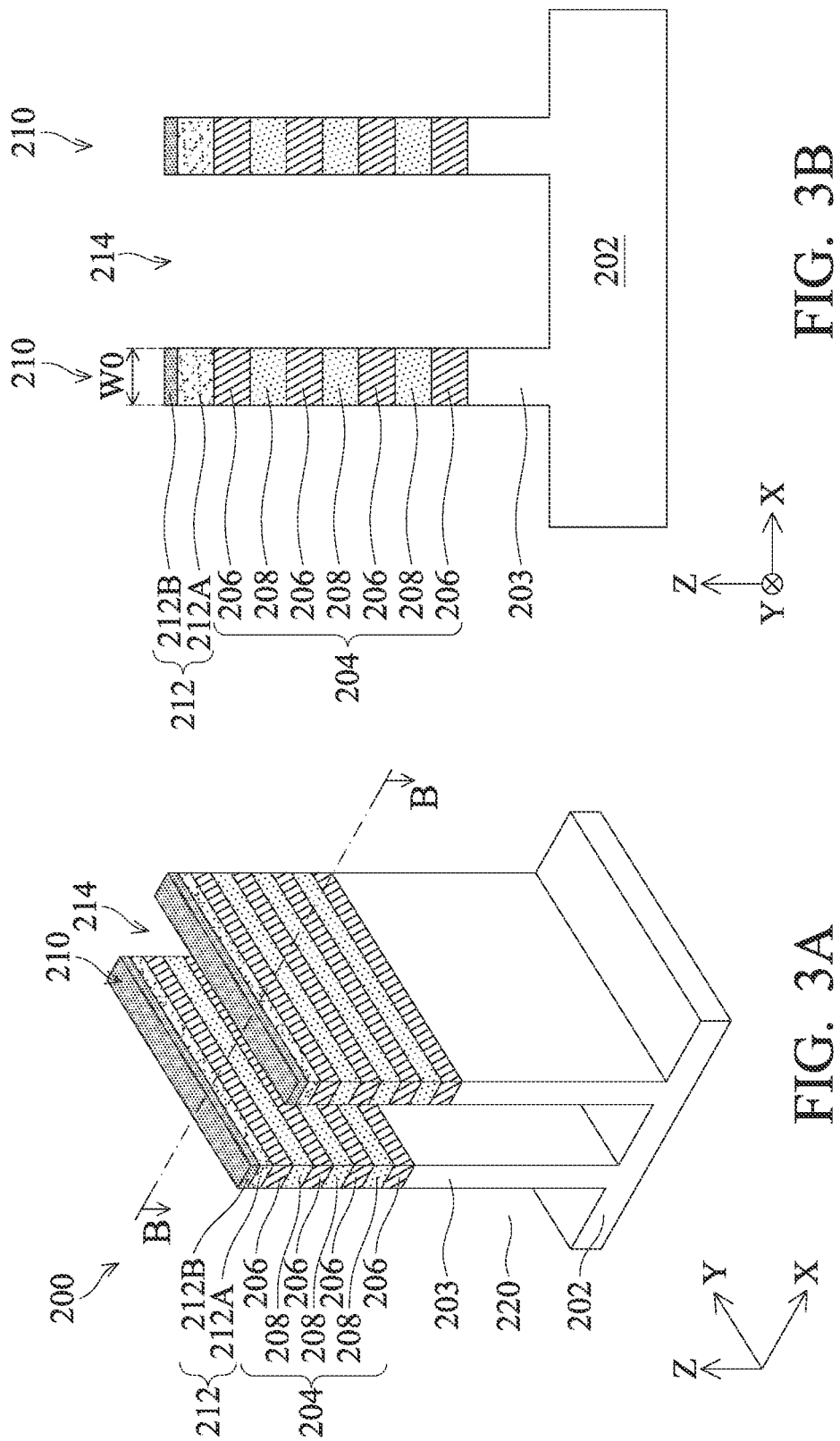

The method 100 at operation 102 (FIG. 1A) provides (or is provided with) a semiconductor device (or device) 200. Referring to FIGS. 2A and 2B, the device 200 includes a substrate 202 and an epitaxial stack 204 above the substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type field effect transistors (N-FET), p-type field effect transistors (P-FET)). The suitable doping may include ion implantation of dopants and/or diffusion processes. The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features.

The epitaxial stack 204 includes epitaxial layers 206 of a first composition interposed by epitaxial layers 208 of a second composition. The first and second compositions can be different. The epitaxial layers 208 may include the same composition as the substrate 202. In the illustrated embodiment, the epitaxial layers 206 are silicon germanium (SiGe) and the epitaxial layers 208 are silicon (Si). However, other embodiments are possible including those that provide for a first composition and a second composition having different oxidation rates and/or etch selectivity. For example, in some embodiments, either of the epitaxial layers 206, 208 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layers 206 and 208 are substantially dopant-free (i.e., having an extrinsic dopant concentration from about 0 cm$^{-3}$ to about 1×10$^{17}$ cm$^{-3}$), where for example, no intentional doping is performed during the epitaxial growth process. By way of example, epitaxial growth of the epitaxial layers 206 and 208 of the respective first and second compositions may be performed by a molecular beam epitaxy (MBE) process, a metalorganic chemical vapor deposition (MOCVD) process, and/or other suitable epitaxial growth processes. In various embodiments, the substrate 202 is a crystalline substrate, and the epitaxial layers 206 and 208 are crystalline semiconductor layers.

In some embodiments, each epitaxial layer 206 has a thickness ranging from about 4 nanometers (nm) to about 8 nm. The epitaxial layers 206 may be substantially uniform in thickness. Yet the top epitaxial layer 206 may be thinner (e.g., half the thickness) than other epitaxial layers 206 thereunder in some embodiments. The top epitaxial layer 206 functions as a capping layer providing protections to other epitaxial layers in subsequent processes. In some embodiments, each epitaxial layer 208 has a thickness ranging from about 4 nm to about 8 nm. In some embodiments, the epitaxial layers 208 of the stack are substantially uniform in thickness. As described in more detail below, the epitaxial layers 208 or portions thereof may form channel member(s) of the subsequently-formed multi-gate device 200 and the thickness is chosen based on device performance considerations. The term channel member(s) (or channel layer(s)) is used herein to designate any material portion for channel(s) in a transistor with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The epitaxial layers 206 in channel regions(s) may eventually be removed and serve to define a vertical distance between adjacent channel members for a subsequently-formed multi-gate device and the thickness is chosen based on device performance considerations. Accordingly, the epitaxial layers 206 may also be referred to as sacrificial layers, and epitaxial layers 208 may also be referred to as channel layers.

It is noted that four (4) layers of the epitaxial layers 206 and three (3) layers of the epitaxial layers 208 are alternately arranged as illustrated in FIGS. 2A and 2B, which is for illustrative purposes only and not intended to be limiting beyond what is specifically recited in the claims. It can be appreciated that any number of epitaxial layers can be formed in the epitaxial stack 204; the number of layers depending on the desired number of channels members for the device 200. In some embodiments, the number of epitaxial layers 208 is between 2 and 10. It is also noted that while the epitaxial layers 206, 208 are shown as having a particular stacking sequence, where an epitaxial layer 206 is the topmost layer of the epitaxial stack 204, other configurations are possible. For example, in some cases, an epitaxial layer 208 may alternatively be the topmost layer of the epitaxial stack 204. Stated another way, the order of growth for the epitaxial layers 206, 208, and thus their stacking sequence, may be switched or otherwise be different than what is shown in the figures, while remaining within the scope of the present disclosure.

The method 100 then proceeds to operation 104 (FIG. 1A) where semiconductor fins (also referred to as device fins or fin elements) are formed by patterning. With reference to the example of FIGS. 3A and 3B, in an embodiment of operation 104, a plurality of semiconductor fins 210 extending from the substrate 202 are formed. In various embodiments, each of the semiconductor fins 210 includes a base portion 203 (also referred to as mesa) formed from the substrate 202 and an epitaxial stack portion 204 formed from portions of each of the epitaxial layers of the epitaxial stack including epitaxial layers 206 and 208. The semiconductor fins 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 210 by etching initial epitaxial stack 204. The etching process can include dry etching, wet etching, reactive ion etching (RIE), and/or other suitable processes.

In the illustrated embodiment, a hard mask (HM) layer 212 is formed over the epitaxial stack 204 prior to patterning the semiconductor fins 210. In some embodiments, the HM layer 212 includes an oxide layer 212A (e.g., a pad oxide layer that may include silicon oxide) and a nitride layer 212B (e.g., a pad nitride layer that may include silicon nitride) formed over the oxide layer 212A. The oxide layer 212A may act as an adhesion layer between the epitaxial stack 204 and the nitride layer 212B and may act as an etch stop layer for etching the nitride layer 212B. In some examples, the HM layer 212 includes thermally grown oxide, chemical vapor deposition (CVD)-deposited oxide, and/or atomic layer deposition (ALD)-deposited oxide. In some embodiments, the HM layer 212 includes a nitride layer deposited by CVD and/or other suitable technique.

The semiconductor fins 210 may subsequently be fabricated using suitable processes including photolithography and etch processes. The photolithography process may include forming a photoresist layer (not shown) over the HM layer 212, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 214 in unprotected regions through the HM layer 212, through the epitaxial stack 204, and into the substrate 202, thereby leaving the plurality of extending semiconductor fins 210. The trenches 214 may be etched using dry etching, wet etching, RIE, and/or other suitable processes. In some examples, a width W0 of the semiconductor fin 210 ranges from about 20 nm to about 30 nm.

Numerous other embodiments of methods to form the semiconductor fins on the substrate may also be used including, for example, defining the fin region (e.g., by mask or isolation regions) and epitaxially growing the epitaxial stack 204 in the form of the semiconductor fins 210. In some embodiments, forming the semiconductor fins 210 may include a trim process to decrease the width of the semiconductor fins 210. The trim process may include wet and/or dry etching processes.

Figures 4A, 4B:
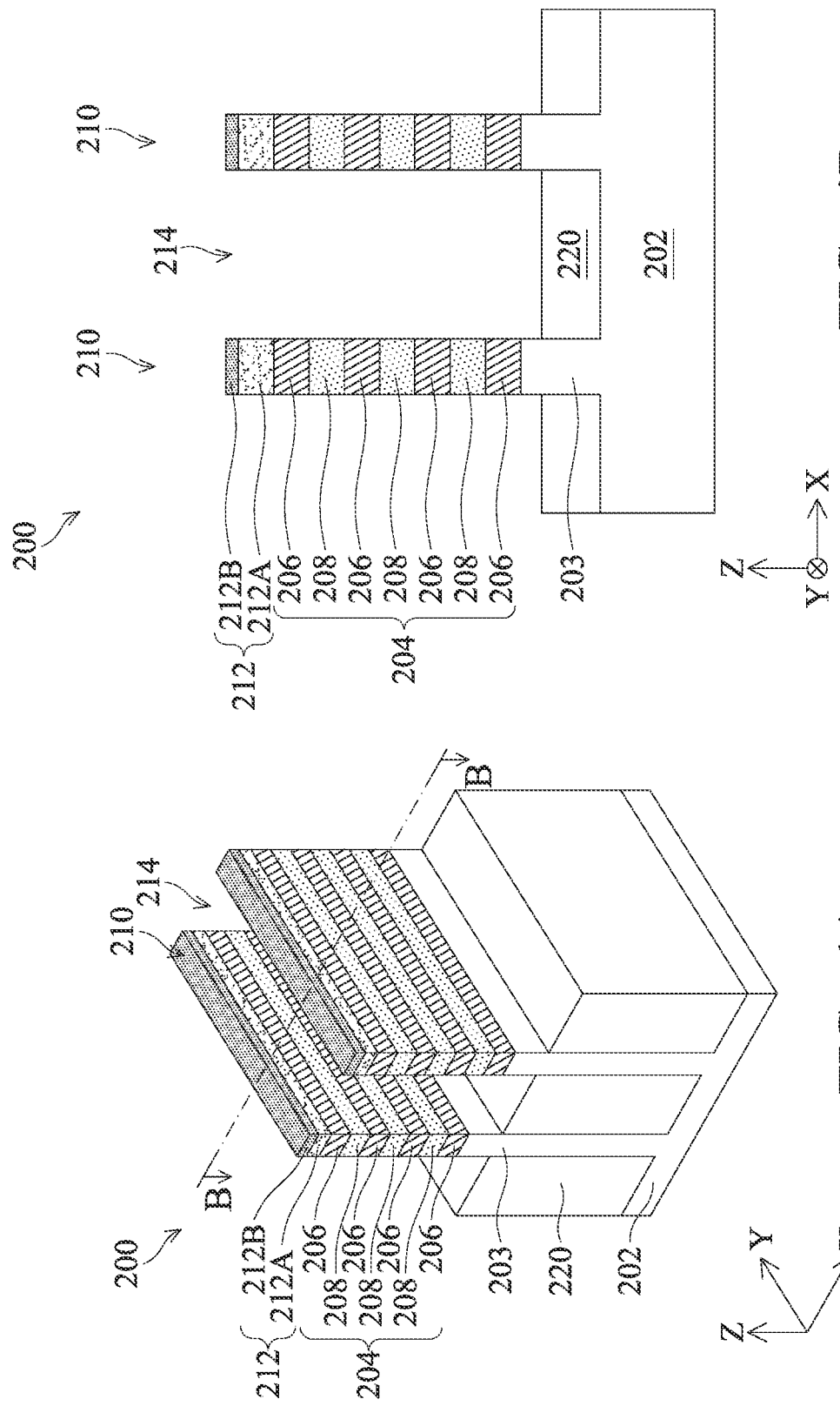

At operation 106, the method 100 (FIG. 1A) forms isolation features, such as shallow trench isolation (STI) features, between the semiconductor fins 210. Referring to FIGS. 4A and 4B, STI features 220 is disposed on the substrate 202 interposing the semiconductor fins 210. By way of example, in some embodiments, a dielectric layer is first deposited over the substrate 202, filling the trenches 214 with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments, after deposition of the dielectric layer, the device 200 may be annealed, for example, to improve the quality of the dielectric layer. In some embodiments, the dielectric layer may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 212 functions as a CMP stop layer. Subsequently, the dielectric layer interposing the semiconductor fins 210 are recessed. Still referring to the example of FIGS. 4A and 4B, the STI features 220 are recessed providing the semiconductor fins 210 extending above the STI features 220. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the semiconductor fins 210. In the illustrated embodiment, the desired height exposes each of the layers of the epitaxial stack 204. In furtherance of the embodiment, a top surface of the STI features 220 is recessed below the bottommost epitaxial layer 206.

Figures 5A, 5B:
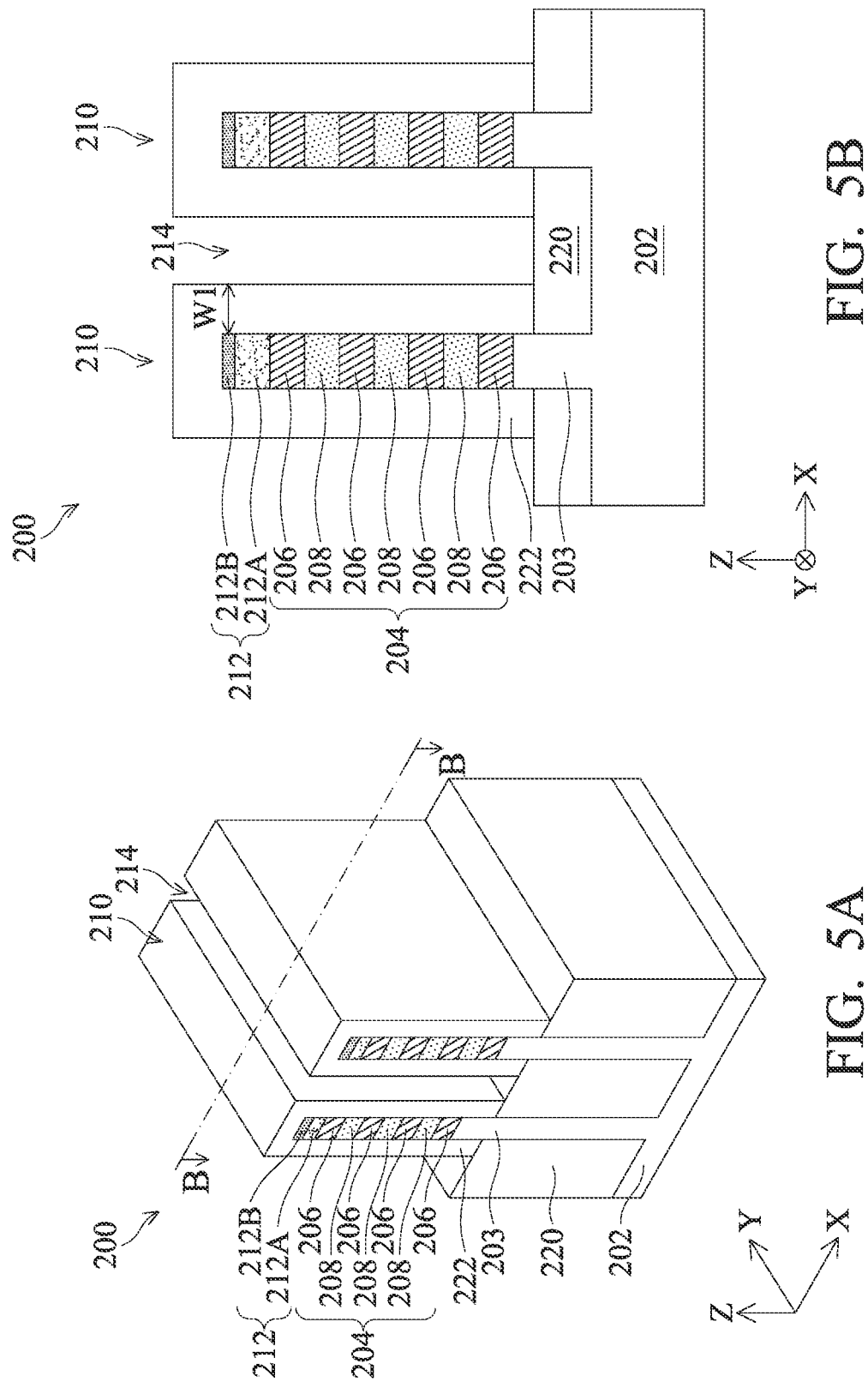

At operation 108, the method 100 (FIG. 1A) deposits a cladding layer on top and sidewall surfaces of the semiconductor fins. Referring to FIGS. 5A and 5B, in the illustrated embodiment, the cladding layer 222 is selectively deposited over the device 200. In particular, the cladding layer 222 may be selectively and conformally deposited over the exposed surfaces of the semiconductor fins 210. In various embodiments, the cladding layer 222 is not deposited on top surfaces of the STI features 220 between the semiconductor fins 210. For example, the cladding layer 222 may be a semiconductor layer and deposited by an epitaxial growing process, such that the epitaxial growth of the cladding layer 222 is limited to exposed semiconductor surfaces of the semiconductor fins 210, which functions as a seed layer, but not on dielectric material surfaces of the STI features 220. Alternatively, the cladding layer 222 may be deposited as a blanket layer covering the device 200. Subsequently, horizontal portions of the cladding layer 222 are removed in an anisotropic etch process, such as a dry etching process (e.g., RIE etching), leaving remaining portions on top and sidewall surfaces of the semiconductor fins 210. By way of example, the cladding layer 222 may be deposited by an MBE process, an MOCVD process, an ALD process, and/or other suitable deposition processes. As will be explained in detail below, the cladding layer 222 reserves a space for subsequently formed metal gate stack and will be removed in a subsequent processing stage. Therefore, the cladding layer 222 is also referred to as a sacrificial cladding layer. In some examples, a thickness W1 of the cladding layer 222 ranges from about 5 nm to about 20 nm.

In some embodiments, the cladding layer 222 includes the same semiconductor material as the epitaxial layers 206, such as silicon germanium (SiGe), but in difference germanium concentrations. For example, the molar ratio of germanium may range from about 15% to about 25% in the epitaxial layers 206, and the molar ratio of germanium may range from about 40% to about 50% in the cladding layer 222. The difference in germanium concentration provides etch selectivity between the cladding layer 222 and the epitaxial layers 206. In some alternative embodiments, the cladding layer 222 includes the same semiconductor material as the epitaxial layers 206, such as silicon germanium (SiGe), including the same germanium concentration. In furtherance of the embodiment, an oxide liner (not shown) may be formed on exposed semiconductor surfaces of the semiconductor fins 210 prior to the deposition of the cladding layer 222. The oxide liner separates the cladding layer 222 from the epitaxial layers 206 and protects the epitaxial layers 206 in subsequent removal of the cladding layer 222. The oxide liner is formed by oxidizing exposed semiconductor surfaces of the semiconductor fins 210. The oxidation process results in the oxide liner having a determined thickness. For example, the oxide liner may have a thickness from about 1 nm to about 3 nm. In some embodiments, the oxidation process comprises a rapid thermal oxidation (RTO) process, high pressure oxidation (HPO), chemical oxidation process, in-situ stream generation (ISSG) process, or enhanced in-situ stream generation (EISSG) process. In some embodiments, the RTO process is performed at a temperature of about 400° C. to about 700° C., using $O_2$ and $O_3$ as reaction gases, for about 1 second to about 30 seconds. In other embodiments, an HPO is performed using a process gas of $O_2$, $O_2+N_2$, $N_2$, or the like, at a pressure from about 1 atm to about 25 atm and a temperature from about 300° C. to about 700° C., for about 1 minute to about 10 minutes. Examples of a chemical oxidation process include wet SPM clean, wet $O_3/H_2O$, or the like. The $O_3$ may have a concentration of about 1 ppm to about 50 ppm.

In some embodiments, the semiconductor material in the cladding layer 222 is in either amorphous form or polycrystalline form, such as amorphous SiGe or polycrystalline SiGe in some embodiments. In yet some embodiments, the cladding layer 222 may have a mixture of semiconductor material in both amorphous form and polycrystalline form, such as 60% SiGe in amorphous form and 40% SiGe in polycrystalline form. The term "amorphous or polycrystalline" is used herein to designate composition in amorphous form, polycrystalline form, or a combination thereof.

Figures 6A, 6B:
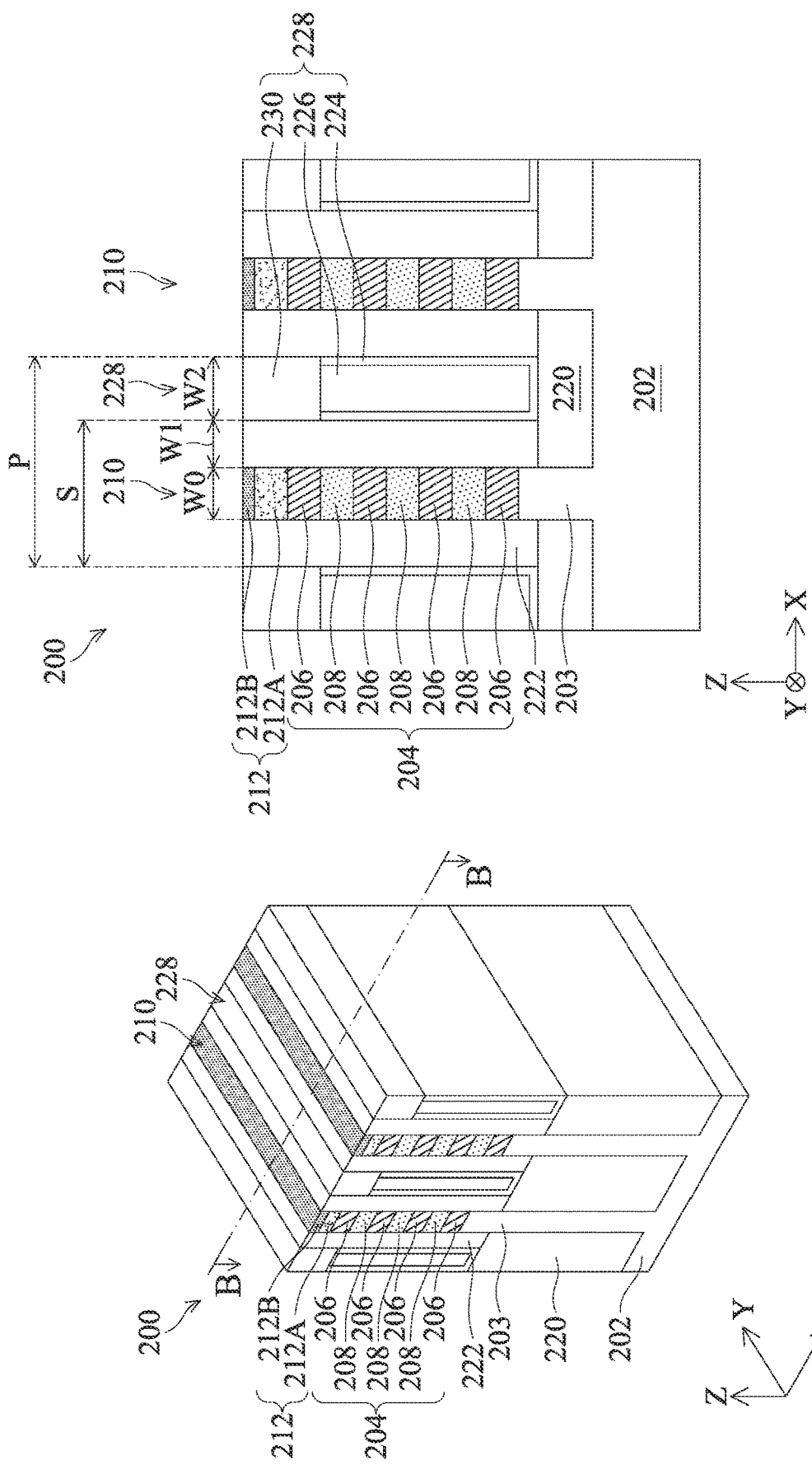

At operation 110, the method 100 (FIG. 1A) forms dielectric fins between adjacent semiconductor fins. Referring to FIGS. 6A and 6B, in an embodiment of operation 110, a dielectric layer 224 is deposited conformally within the trenches 214 including along sidewalls of the cladding layer 222 and along a top surface of the STI features 220. Thereafter, a dielectric layer 226 is deposited over the dielectric layer 224. In at least some embodiments, the dielectric layers 224 and 226 may collectively define a dielectric fin (or hybrid fin) 228. In some cases, a dielectric fin 228 may further include a high-k dielectric layer formed over the dielectric layers 224 and 226, for example after recessing of the dielectric layers 224 and 226, as discussed below. Generally, and in some embodiments, the dielectric layers 224 and 226 may include SiN, SiCN, SiOC, SiOCN, SiOx, or other appropriate material. In some examples, the dielectric layer 224 may include a low-k dielectric layer, and the dielectric layer 226 may include a flowable oxide layer. In various cases, the dielectric layers 224 and 226 may be deposited by a CVD process, an ALD process, a PVD process, a spin-coating and baking process, and/or other suitable process. In some examples, after depositing the dielectric layers 224 and 226, a CMP process may be performed to remove excess material portions and to planarize a top surface of the device 200.

The method 100 at operation 110 may further include a recessing process, a high-k dielectric layer deposition process, and a CMP process. Still referring to FIGS. 6A and 6B, in an embodiment of operation 110, a recessing process is performed to remove top portions of the dielectric layers 224 and 226. In some embodiments, the recessing process may include a dry etching process, a wet etching process, and/or a combination thereof. In some embodiments, a recessed depth is controlled (e.g., by controlling an etching time) to result in a desired recessed depth. In some embodiments, the recessing process may optionally remove at least part of the cladding layer 222. After performing the recessing process, and in a further embodiment of operation 110, a high-k dielectric layer 230 is deposited within trenches formed by the recessing process. In some embodiments, the high-k dielectric layer 230 may include $HfO_2$, $ZrO_2$, HfAlOx, HfSiOx, $Y_2O_3$, $Al_2O_3$, or another high-k material. The high-k dielectric layer 230 may be deposited by a CVD process, an ALD process, a PVD process, and/or other suitable process. After deposition of the high-k dielectric layer 230, and in a further embodiment of operation 110, a CMP process is performed to remove excess material portions and to planarize a top surface of the device 200. In some examples, the CMP process removes a portion of the cladding layer 222 from the top of the semiconductor fins 210 to expose the HM layer 212. Thus, in various cases, a dielectric fin 228 is defined as having a lower portion including the recessed portions of the dielectric layers 224, 226 and an upper portion including the high-k dielectric layer 230. In some examples, a height of the high-k dielectric layer 230 may be about 20 nm to about 30 nm with a width W2 ranging from about 15 nm to about 25 nm. In some cases, a dielectric fin 228 may be alternatively described as a bi-layer dielectric having a high-k upper portion and a low-k lower portion. In some examples, a height ratio of the upper portion to the lower portion may be about 1:20 to about 20:1. The height ratio may be adjusted, for example, by changing the recess depth and thus the height of the high-K dielectric layer 230, as noted above. In the illustrated embodiment, the recessed top surfaces of the dielectric layers 224 and 226 are substantially level (or termed as coplanar) with a top surface of the top epitaxial layer 208.

Referring to FIG. 6B, spacing S between adjacent dielectric fins 228 is about W0+2*W1 and ranges from about 25 nm to about 55 nm, and a pitch P of the dielectric fins 228 is about W0+2*W1+W2 and ranges from about 60 nm to about 70 nm, in some embodiments. As will be discussed in more detail below, the dielectric fins 228 are used to effectively prevent the lateral merging of S/D epitaxial features formed between adjacent semiconductor fins 210. During the epitaxial growth, S/D epitaxial features laterally expand between opposing sidewalls of the dielectric fins 228 and substantially fill the spacing S. Thus, the existence of the cladding layer 222 increases the spacing S between adjacent dielectric fins 228 and consequently leads to a larger volume of the to-be-formed S/D epitaxial features.

Figure 7B:
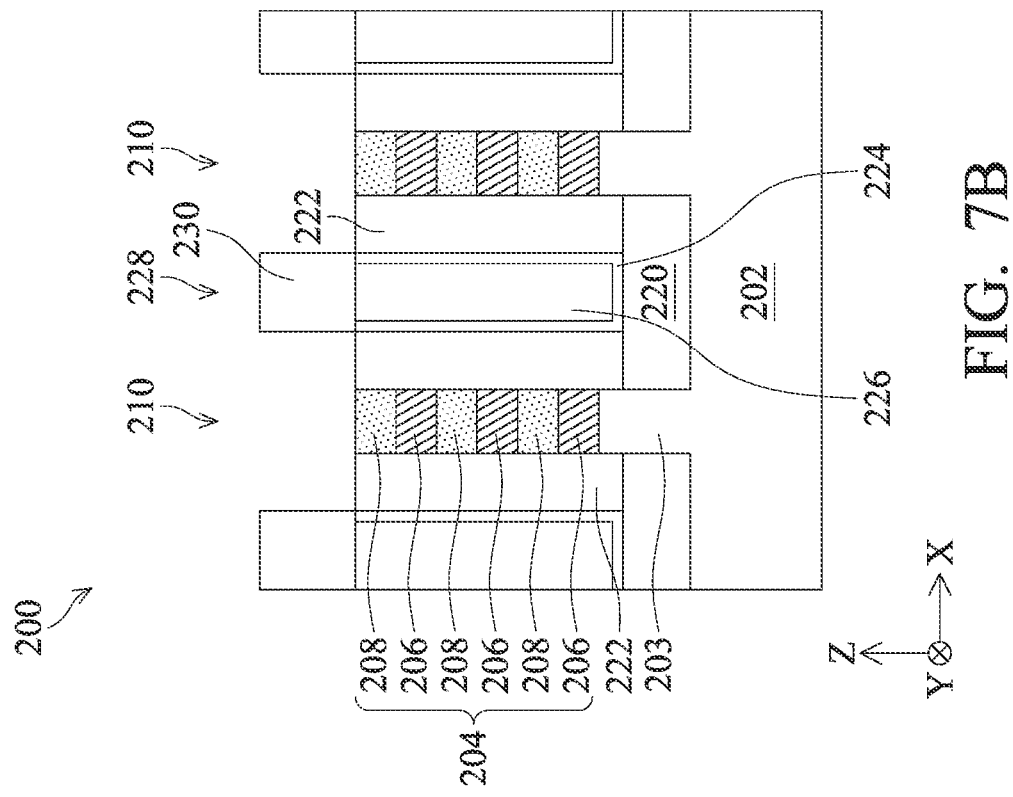
Figure 7A:
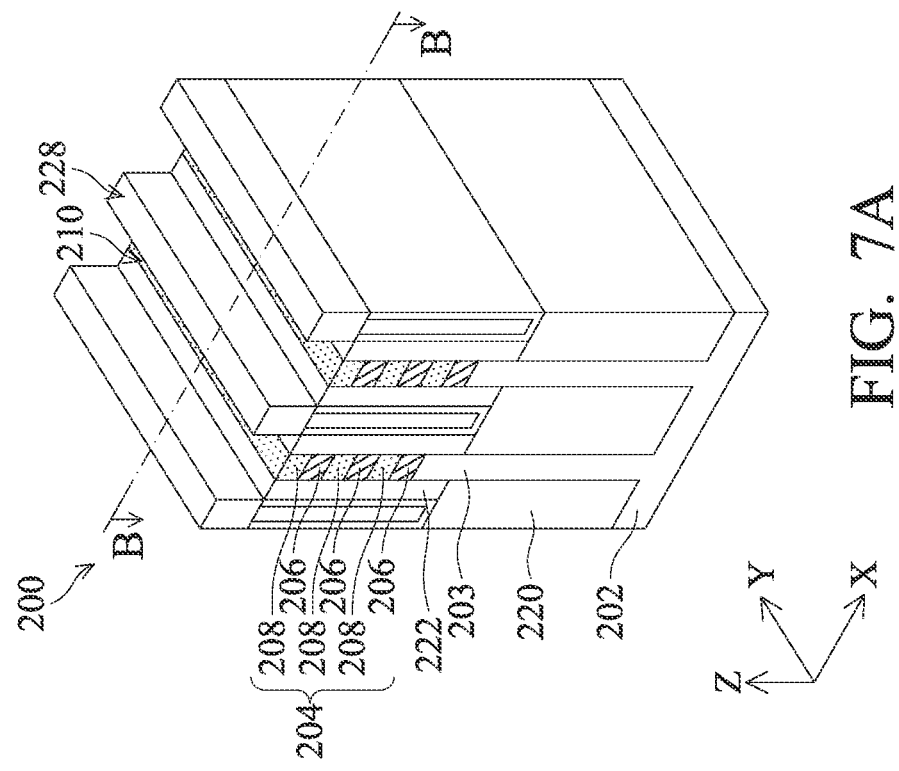
Figures 10A, 10B:
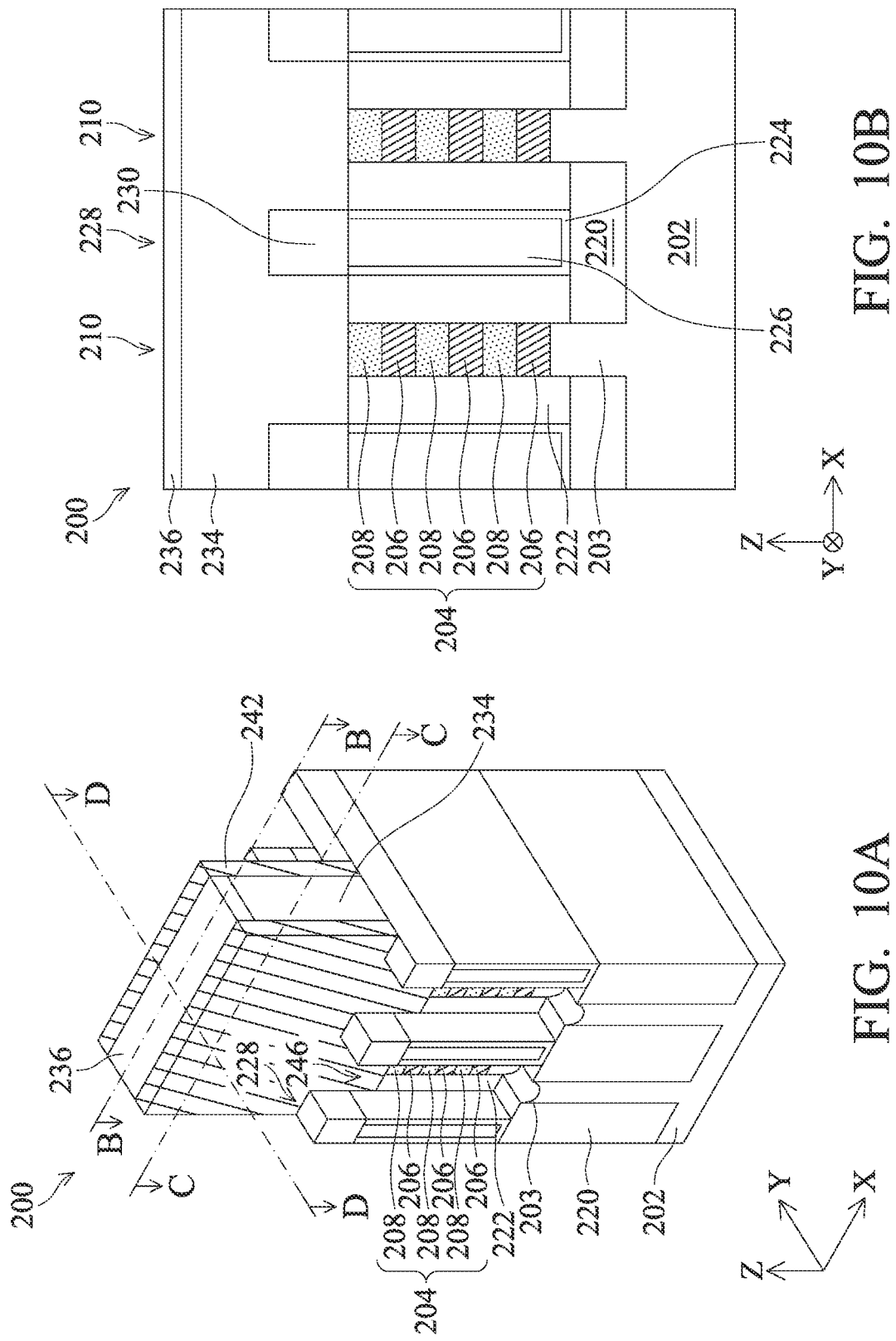
Figures 10C, 10D:
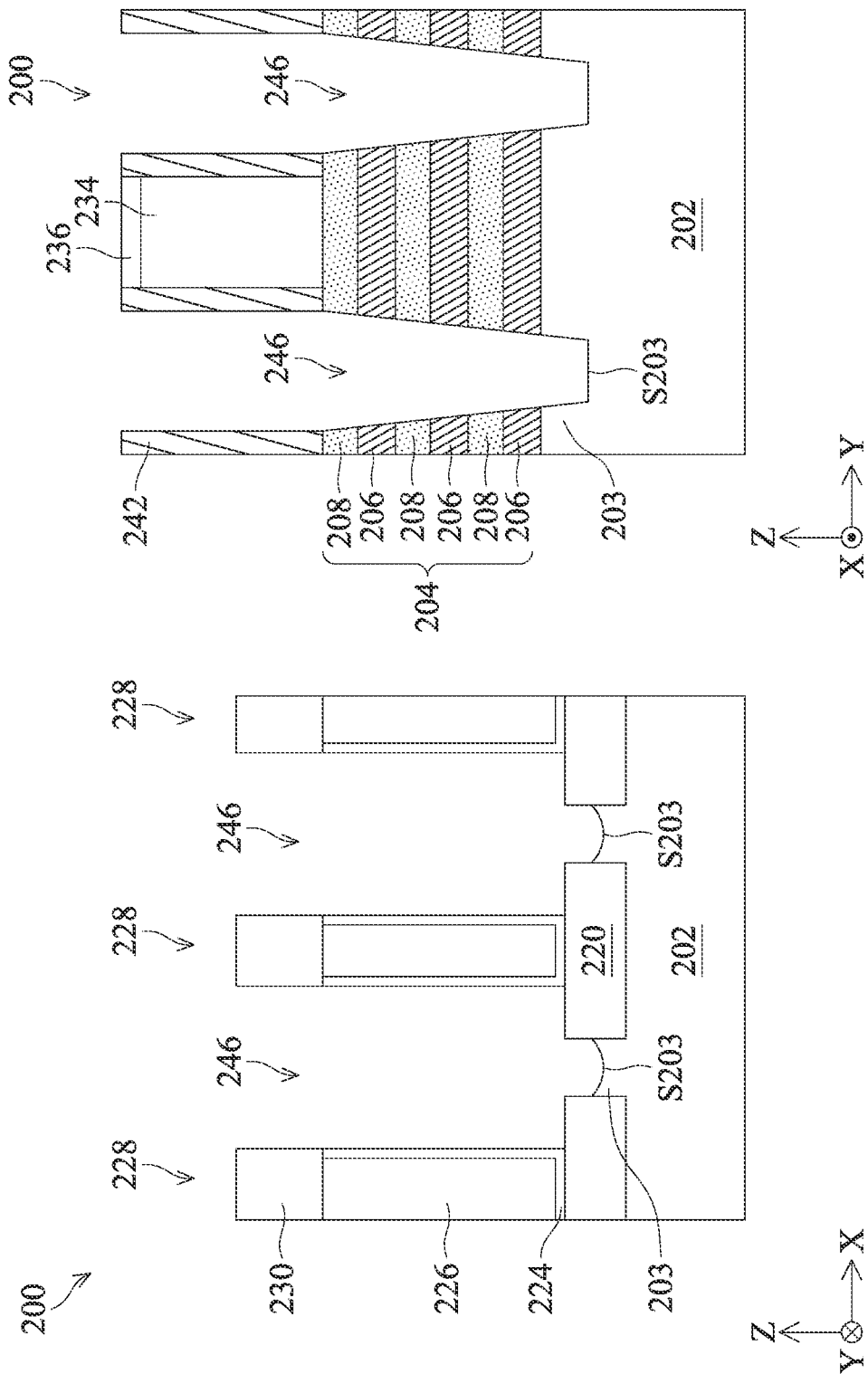

At operation 112, the method 100 (FIG. 1A) removes the HM layer 212 and a top portion of the cladding layer 222. Referring to FIGS. 7A and 7B, in an embodiment of operation 112, the HM layer 212 and a top portion of the cladding layer 222 may initially be etched-back. The topmost epitaxial layer 206 may act as an etch stop layer for etching the HM layer 212 and be subsequently removed. The top potion of the cladding layer 222 may be removed together with the topmost epitaxial layer 206 by the same etchant that targets the same semiconductor material, such as SiGe. In some embodiments, a top surface of the etched-back cladding layer 222 is substantially level with top surfaces of the topmost epitaxial layer 208 of the semiconductor fins 210. In some embodiments, the etch-back of the HM layer 212 and the top portion of the cladding layer 222 may be performed using a wet etch process, a dry etch process, a multiple-step etch process, and/or a combination thereof. The HM layer 212 may be removed, for example, by a wet etching process using $H_3PO_4$ or other suitable etchants.

The method 100 then proceeds to operation 114 (FIG. 1A) where a dummy gate structure is formed. While the present discussion is directed to a replacement gate (or gate-last) process whereby a dummy gate structure is formed and subsequently replaced, other configurations may be possible. With reference to FIGS. 8A and 8B, a dummy gate structure 234 is formed. The dummy gate structure 234 will be replaced by a final gate stack at a subsequent processing stage of the device 200. In particular, the dummy gate structure 234 may be replaced at a later processing stage by a high-k dielectric layer (HK) and metal gate electrode (MG), as will be discussed in more detail below. In some embodiments, the dummy gate structure 234 is disposed over the semiconductor fins 210, the cladding layer 222, and the dielectric fins 228. The portion of the semiconductor fins 210 underlying the dummy gate structure 234 may be referred to as the channel region. The dummy gate structure 234 may also define source/drain (S/D) regions of the semiconductor fins 210, for example, the regions of the semiconductor fin 210 adjacent and on opposing sides of the channel region.

In some embodiments, the dummy gate structure 234 is formed by various process steps such as layer deposition, patterning, etching, as well as other suitable processing steps. Exemplary layer deposition processes include CVD (including low-pressure CVD, plasma-enhanced CVD, and/or flowable CVD), PVD, ALD, thermal oxidation, e-beam evaporation, or other suitable deposition techniques, or combinations thereof. In some embodiments, the dummy gate structure 234 includes a dummy dielectric layer and a dummy electrode layer. In some embodiments, the dummy dielectric layer may include $SiO_2$, silicon nitride, a high-k dielectric material and/or other suitable material. Subsequently, the dummy electrode layer is deposited. In some embodiments, the dummy electrode layer may include polycrystalline silicon (polysilicon). In forming the dummy gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate structure 234 is patterned through a hard mask 236. The hard mask 236 may include multiple layers, such as an oxide layer and a nitride layer over the oxide layer. In some embodiments, after formation of the dummy gate structure 234, the dummy dielectric layer is removed from the S/D regions of the semiconductor fins 210. The etch process may include a wet etch, a dry etch, and/or a combination thereof. The etch process is chosen to selectively etch the dummy dielectric layer without substantially etching the semiconductor fins 210, the hard mask 236, and the dummy electrode layer.

At operation 116, the method 100 (FIG. 1A) forms gate spacers on sidewall surfaces of the dummy gate structure 234. With reference to FIGS. 9A-9D, gate spacers 242 are formed. The gate spacers 242 may have a thickness from about 2 nm to about 10 nm. In some examples, the gate spacers 242 may include a dielectric material such as silicon oxide, silicon nitride, silicon carbide, silicon oxynitride, SiCN, silicon oxycarbide, SiOCN, a low-k material, and/or combinations thereof. In some embodiments, the gate spacers 242 include multiple layers, such as a liner spacer layer and a main spacer layer, and the like. By way of example, the gate spacers 242 may be formed by conformally depositing a dielectric material over the device 200 using processes such as a CVD process, a subatmospheric CVD (SACVD) process, a flowable CVD process, an ALD process, a PVD process, or other suitable process. Following the conformal deposition of the dielectric material, portions of the dielectric material used to form the gate spacers 242 may be etched-back to expose portions of the semiconductor fins 210 not covered by the dummy gate structures 234 (e.g., in source/drain regions). In some cases, the etch-back process removes portions of dielectric material used to form the gate spacers 242 along a top surface of the dummy gate structure 234, thereby exposing the hard mask layer 236. In some embodiments, the etch-back process may include a wet etch process, a dry etch process, a multiple-step etch process, and/or a combination thereof. It is noted that after the etch-back process, the gate spacers 242 remain disposed on sidewall surfaces of the dummy gate structure 234.

At operation 118, the method 100 (FIG. 1A) recesses the semiconductor fins 210 in the S/D regions in forming S/D recesses. With reference to FIGS. 10A-10D, a source/drain etch process is performed to form the S/D recesses 246 by removing portions of the semiconductor fins 210 and the cladding layer 222 not covered by the dummy gate structure 234 (e.g., in source/drain regions) and that were previously exposed (e.g., during the gate spacers 242 etch-back process). In particular, the source/drain etch process may serve to remove the exposed epitaxial layer portions 206 and 208 in source/drain regions of the device 200 to expose the base portion 203 of the semiconductor fins 210. In some embodiments, the source/drain etch process may include a dry etching process, a wet etching process, and/or a combination thereof. In some embodiments, a recessed depth is controlled (e.g., by controlling an etching time) such that the top surface $S_{203}$ of the base portion 203 is recessed to be under the top surface of the STI features 220, such as for about 2 nm to about 5 nm in some examples. Due to the loading effect during the source/drain etch process, sidewalls of the S/D recesses 246 may have a tapered profile (FIG. 10D), such that the S/D recesses 246 are narrower in the bottom portion and wider in the top portion, and consequently the semiconductor fin 210 between two adjacent S/D recesses 246 is wider in the bottom portion and narrower in the top portion.

Figures 11C, 11D:
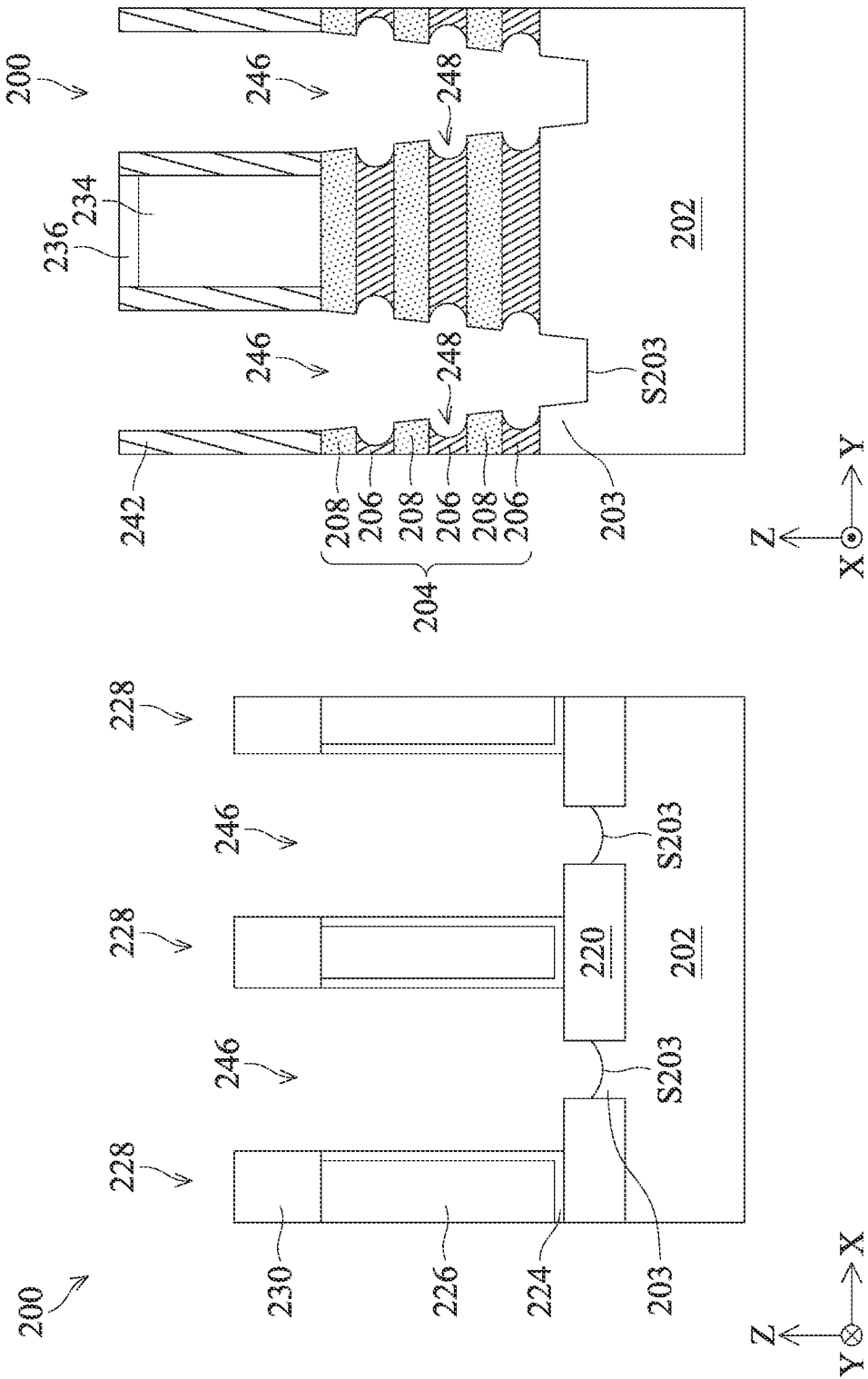

At operation 120, the method 100 (FIG. 1B) forms inner spacer cavities. With reference to FIGS. 11A-11D, by laterally recessing the epitaxial layers 206 through S/D recesses 246, inner spacer cavities 248 are formed. In some embodiments of operation 120, a lateral etching (or horizontal recessing) is performed to recess the epitaxial layers 206 to form inner spacer cavities 248. The amount of etching of the epitaxial layers 206 is in a range from about 2 nm to about 10 nm in some embodiments. The lateral etching also recesses the cladding layer 222 in the Y-direction (FIG. 11A). When the epitaxial layers 206 and the cladding layer 222 are SiGe, the lateral etching process may use an etchant selected from, but not limited to, ammonium hydroxide ($NH_4OH$), tetramethylammonium hydroxide (TMAH), ethylenediamine pyrocatechol (EDP), and potassium hydroxide (KOH) solutions. In some embodiments, recessed sidewalls of the cladding layer 222 are substantially flush with the sidewall surfaces of the dummy gate structure 234. Here, "being substantially flush" means the difference in the relative position is less than about 1 nm.

At operation 122, the method 100 (FIG. 1B) forms inner spacers. With reference to FIGS. 12A-12D, inner spacers 250 are formed in the inner spacer cavities 248. A length of the inner spacers 250 (along the Y-direction) may range from about 3 nm to about 8 nm, in some embodiments. In some embodiments of operation 122, an insulating layer is formed on the lateral ends of the epitaxial layers 206 to fill the inner spacer cavities 248, thereby forming inner spacers 250. The insulating layer may include a dielectric material, such as SiN, SiOC, SiOCN, SiCN, SiO2, and/or other suitable material. In some embodiments, the insulating layer is conformally deposited in the S/D recesses 246, for example, by ALD or any other suitable method. After the conformal deposition of the insulating layer, an etch-back process is performed to partially remove the insulating layer from outside of the inner spacer cavities 248. By this etching the insulating layer remains substantially within the inner spacer cavities 248. In some examples, the etch-back process may also etch a portion of the high-k dielectric layer 230 of the dielectric fins 228 not covered by the dummy gate structure 234.

Figures 13A, 13B:
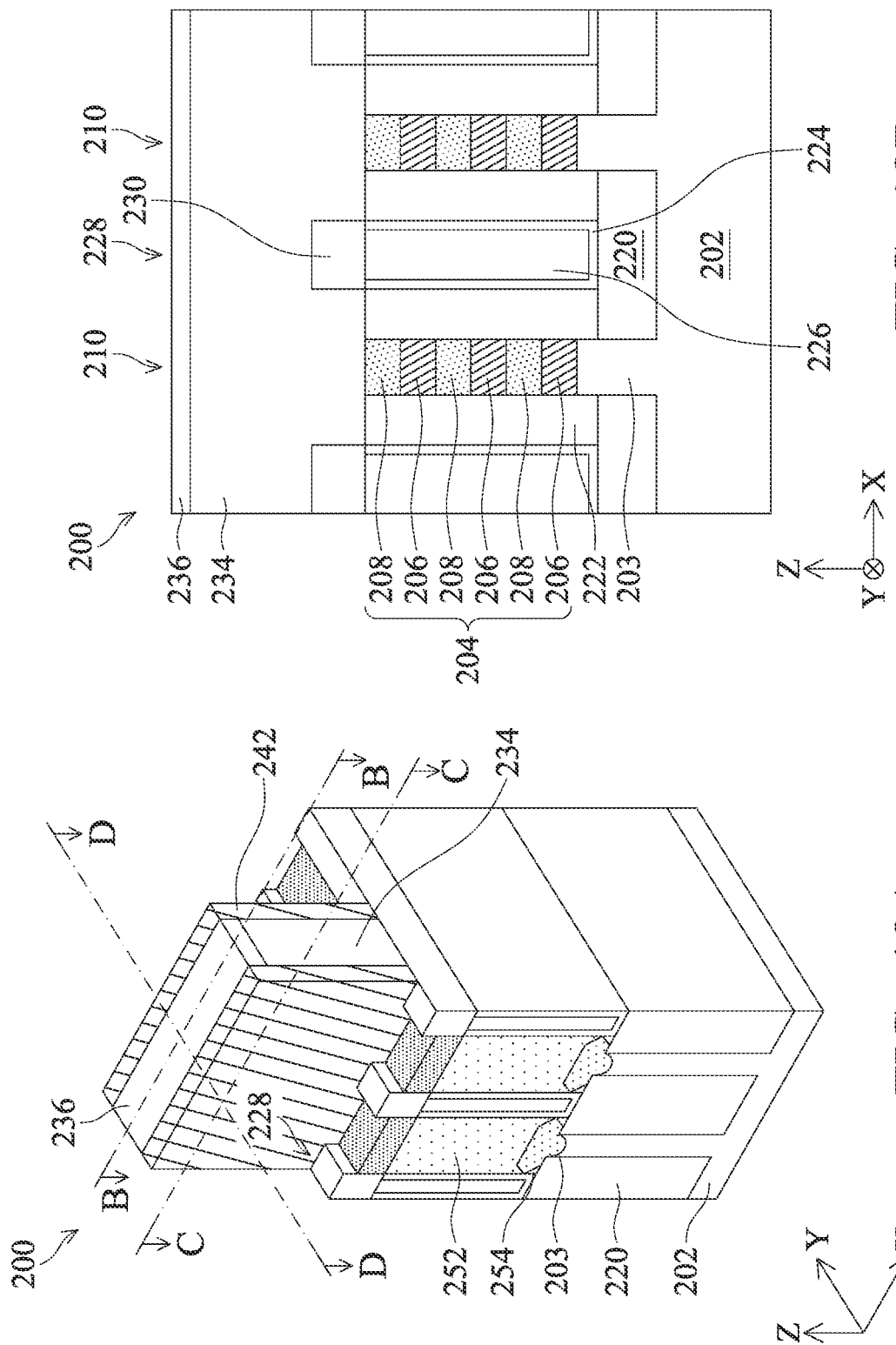
Figures 13C, 13D:
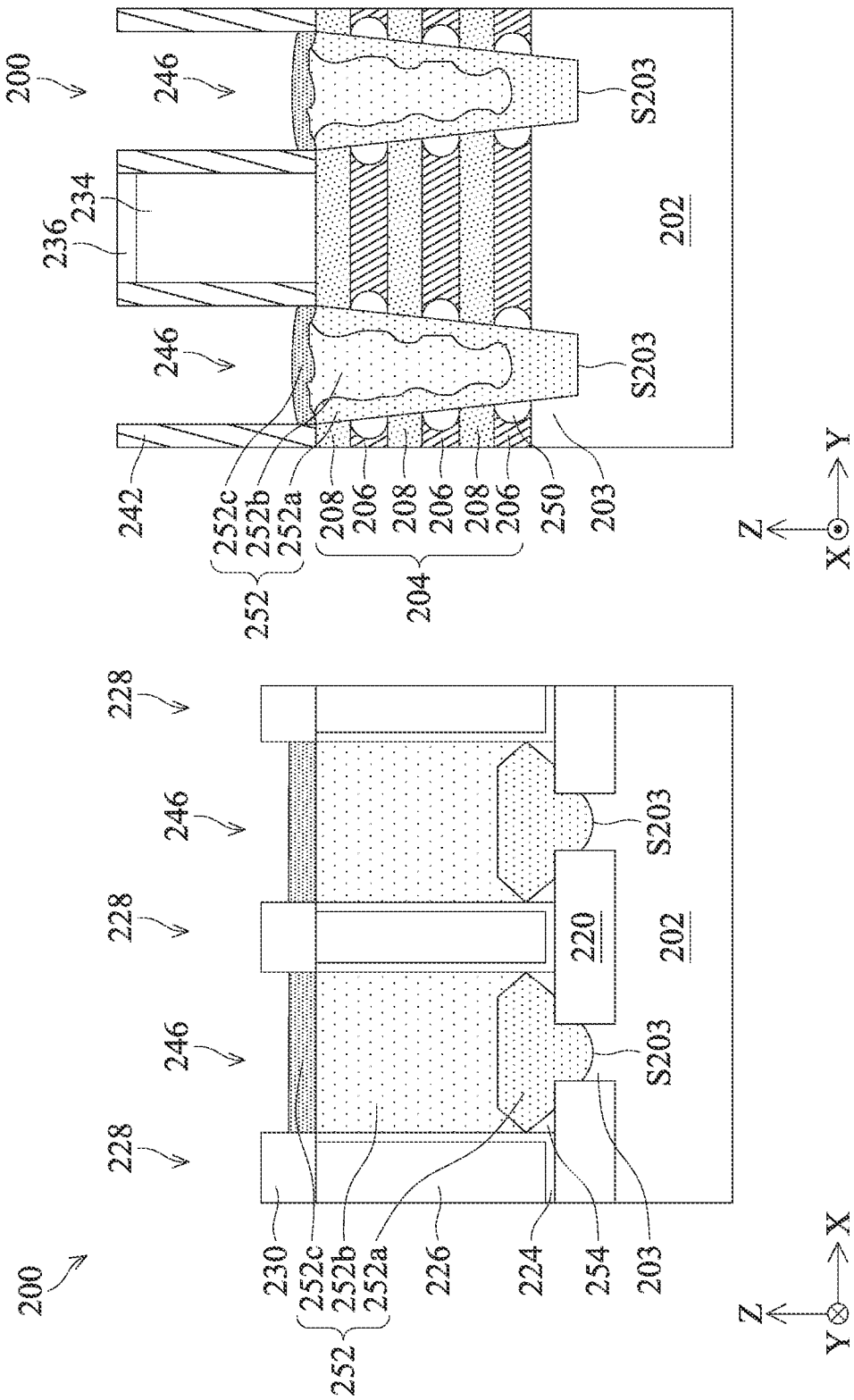
Figures 14A, 14B:
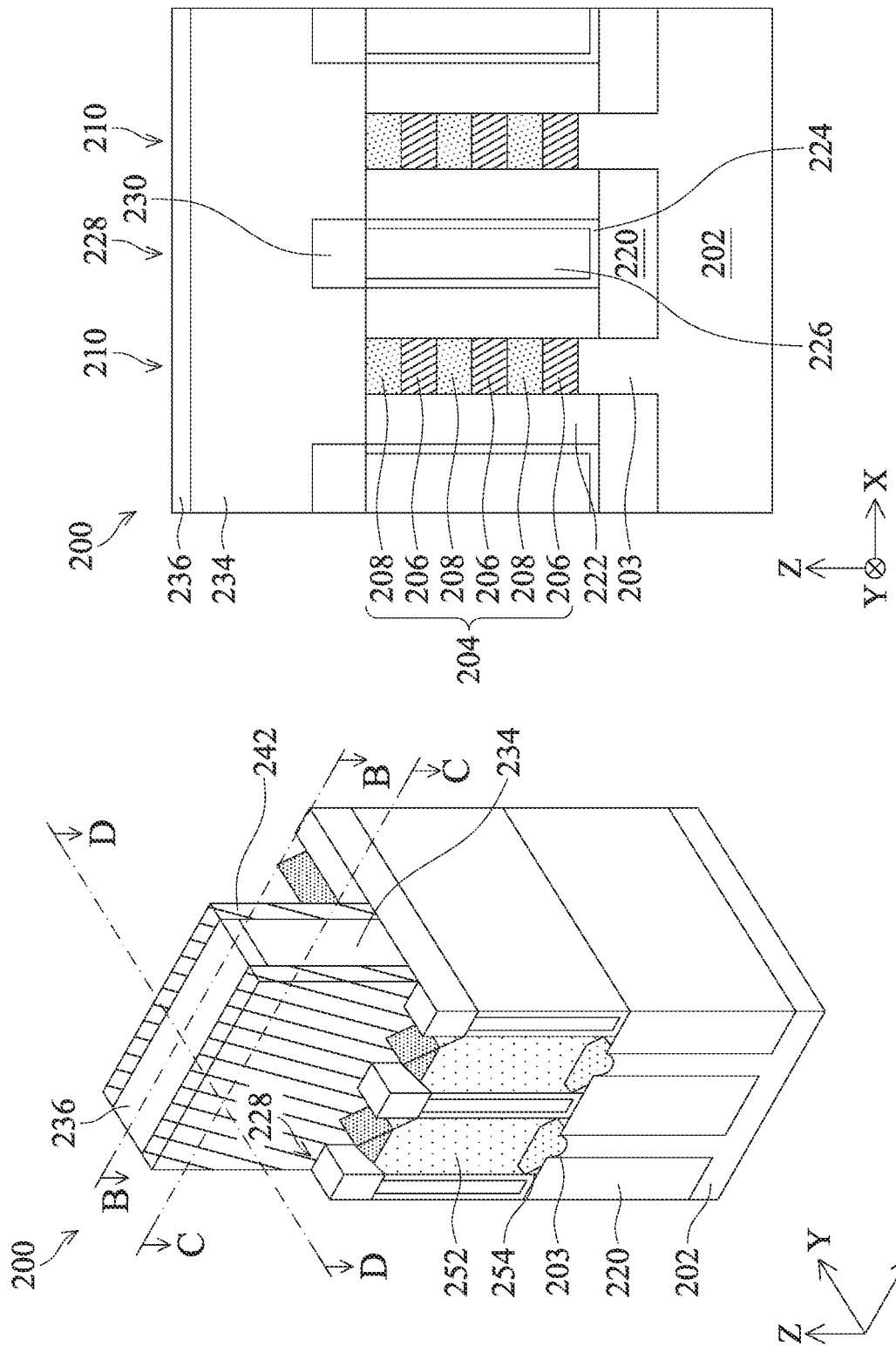

At operation 124, the method 100 (FIG. 1B) forms S/D epitaxial features (also referred to as S/D features). With reference to FIGS. 13A-13D, S/D features 252 are formed in the S/D recesses 246. In some embodiments of operation 124, the S/D features 252 are formed in S/D regions adjacent to and on both sides of the dummy gate structure 234. For example, the S/D features 252 may be formed over the exposed base portions 203 of the semiconductor fins 210 and in contact with the adjacent inner spacers 250 and the channel layers (epitaxial layers 208). The S/D features 252 are also in contact with sidewalls of the dielectric fins 228 in the X-direction. The dielectric fins 228, which may have a partially etched-back high-K dielectric layer 230, effectively prevents the lateral merging of the S/D features 252 formed on the semiconductor fins 210. Referring to FIG. 13C, in the illustrated embodiment, due to the epitaxial growth of crystalline semiconductor materials, a bottom surface of the S/D features 252 has facets intersecting sidewalls of the dielectric fin 228. The facets trap voids (gaps) 254 between the bottom surface of the S/D features 252 and the top surface of the STI features 220. The voids 254 may be filled with ambient environment conditions (e.g., air, nitrogen).

On a whole, the S/D features 252 provides a tensile or compress stress to the channel regions. In various embodiments, the S/D features 252 may include Ge, Si, GaAs, AlGaAs, SiGe, GaAsP, SiP, or other suitable material. In some embodiments, the S/D features 252 are formed by epitaxially growing one or more semiconductor material layers (e.g., epitaxial-grown doped layers 252a, 252b, and 252c) in the S/D regions. In some embodiments, the first epitaxial-grown doped layer 252a makes contact with the exposed base portions 203 of the semiconductor fins 210 and in contact with the adjacent inner spacers 250 and the channel layers (epitaxial layers 208), which is also regarded as epitaxial-grown doped liners to facilitate epitaxial growth of the subsequent epitaxial-grown doped layer 252b. The first epitaxial-grown doped layer 252a forms a U-shaped or a V-shaped structure in the S/D regions (FIG. 13D). The second epitaxial-grown doped layer 252b is located on the first epitaxial-grown doped layer 252a. The third epitaxial-grown doped layer 252c caps the first epitaxial-grown doped layer 252a and the second epitaxial-grown doped layer 252b. In the illustrated embodiment, top surfaces of the second and third epitaxial-grown doped layers 252b and 252c are both above top surfaces of the dielectric layers 224 and 226 of the dielectric fins 228, but lower than the top surface of the high-k dielectric layer 230 of the dielectric fins 228 (FIG. 13C). In some alternative embodiments, the top surface of the third epitaxial-grown doped layer 252c (e.g., facets with a vertex) may be above the top surface of the high-k dielectric layer 230 of the dielectric fins 228.

In one embodiment, the first epitaxial-grown doped layer 252a is made of silicon germanium, which is the same as that of the second epitaxial-grown doped layer 252b. Further, the concentration of the germanium is increasingly grading from the first epitaxial-grown doped layer 252a to the second epitaxial-grown doped layer 252b. Specifically, the first epitaxial-grown doped layer 252a includes a germanium concentration (in molar ratio) in a range from about 10% to about 40%. The second epitaxial-grown doped layer 252b includes a germanium concentration in a range from about 40% to about 65%. In an embodiment, the first epitaxial-grown doped layer 252a includes a germanium concentration in a range from about 10% to about 30%. The second epitaxial-grown doped layer 252b includes a germanium concentration in a range from about 50% to about 70%. The germanium concentration is adjustable to meet different requirements of strain. In addition, the first and second epitaxial-grown doped layers 252a and 252b individually include a gradient distribution. For example, first epitaxial-grown doped layer 252a increasingly grades from its bottommost to its topmost. The third epitaxial-grown doped layer 252c is made of silicon, which refers to a silicon cap layer making contact with and capping the first and second epitaxial-grown doped layers 252a and 252b.

The S/D features 252 may be in-situ doped during the epitaxial process by introducing doping species including: p-type dopants, such as boron or $BF_2$; n-type dopants, such as phosphorus or arsenic; and/or other suitable dopants including combinations thereof. If the S/D features 252 are not in-situ doped, an implantation process (i.e., a junction implant process) is performed to dope the S/D features 252. In an exemplary embodiment, the S/D features 252 in an NMOS device include SiP, while those in a PMOS device include GeSnB and/or SiGeSnB. In one embodiment, the first epitaxial-grown doped layer 252a includes the same dopant species as the second and third epitaxial-grown doped layers 252b and 252c. The dopant concentration is increasingly grading from the first epitaxial-grown doped layer 252a to the third epitaxial-grown doped layer 252c. The third epitaxial-grown doped layer 252c includes a dopant concentration higher than those of the first and second epitaxial-grown doped layers 252a and 252b, which facilitate subsequent silicidation process (e.g., nickel silicide formation) for landing S/D contacts on the S/D features. The second epitaxial-grown doped layer 252b includes a dopant concentration higher than that of the first epitaxial-grown doped layer 252a. Further, the first, second, and third epitaxial-grown doped layers 252a, 252b, and 252c include a constant distribution of dopant concentration individually in some embodiments. For example, the second epitaxial-grown doped layer 252b includes a constant distribution where the dopant concentration is constant from its bottommost to its topmost.

At operation 126, the method 100 (FIG. 1B) modifies the shape of the S/D features 252 through an S/D reshape process. Referring to FIGS. 14A-14D, the profile of the S/D features 252 is reshaped and the volume is reduced. In some embodiments, the top surface of the S/D features 252 is modified using a selective etching process. The selective etching process may include wet etching, dry etching, reactive ion etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF), potassium hydroxide (KOH) solution, ammonia, a solution containing hydrofluoric acid (HF), nitric acid ($HNO_3$), and/or acetic acid ($CH_3COOH$), or other suitable wet etchants. In one example, the selective etching process applies an HCl-containing etchant (e.g., HCl, a mixture of HCl and $SiH_4$, or a mixture of HCl and $GeH_4$) under a temperature from about 600° C. to about 700° C. The etchant reacts with the exposed surfaces of the S/D features 252 and reshapes the S/D features 252.

The S/D reshape process may recess the S/D features 252 for about 1 nm to about 10 nm in some embodiments. By recessing the S/D features 252, the volume of the S/D features 252 is also reduced. Further, the top surface of the S/D features 252 is modified. For example, the top surface of the S/D features 252 may become non-flat, such as having a convex top portion with a vertex (e.g., an arc-shape top portion or a faceted top portion) between two shoulder portions. The vertex is below the top surface of the dielectric fins 228. Referring to FIG. 14C, by selecting an appropriate crystal orientation of the S/D features 252 and respective etchant, the modified top surface of the S/D features 252 may include a faceted top portion that has a facet S1, a vertical portion that has a sidewall S2, and a shoulder portion that has a generally flat surface S3 adjoining the facet S1 through vertical sidewall S2. The transition from the surface S3 to the facet S1 is also referred to as a step profile.

The facet S1 may have a (111) crystalline orientation or a (110) crystalline orientation. As depicted in FIG. 14C, the facet S1 may comprise both the first epitaxial-grown doped layer 252a and the second epitaxial-grown doped layer 252b. The sidewall S2 is substantially vertical, such as from about 70° to about 88° with respect to a horizontal plane in some examples. The two generally flat surfaces S3 on both sides of the vertex are vertically distant from the vertex for heights H1 and H2, respectively. The heights H1 and H2 are also referred to as shoulder heights. The heights H1 and H2 independently range from about 5 nm to about 25 nm in some embodiments. If the heights H1 and H2 are smaller than 5 nm, the volume of the S/D features 252 may still be large, which leads to high parasitic capacitance and strong leakage between S/D contacts and metal gate stacks. If the heights H1 and H2 are larger than 25 nm, some of the top channel layers (epitaxial layers 208) may not be covered, which leads to poor channel layer usage. To illustrate this, FIG. 14C imposes contours (represented by dashed lines) of the epitaxial layers 206 and 208 in the channel regions. As depicted, the recessed S/D features 252 may expose a top corner of the topmost channel layer. While a small fraction of exposure of the top channel layers is acceptable, a large fraction leads to a waste of channel layers. The heights H1 and H2 may be substantially equal to each other, such that the two shoulders are level; or the heights H1 and H2 may be different, such that one shoulder is higher than another. The generally flat surfaces S3 have a width W (horizontal distance from the sidewall S2 to the dielectric fin 228) ranging from about 2 nm to 15 nm. The width W is also referred to as shoulder width. If the width W is less than about 2 nm, it may be difficult to fill the to-be-formed contact etch stop layer (CESL) in such narrow corner regions. If the width W is larger than about 15 nm, some of the top channel layers (epitaxial layers 208) may not be covered, which leads to poor channel layer usage.

Further, regarding the inner spacer 250 filled in the cavities formed by laterally recessing the cladding layer 222, the S/D features 252 prior to the S/D reshape process may fully cover the inner spacer 250. After the S/D reshape process, due to the recessing of the S/D features 252, the top portion of the sidewalls of the inner spacer 250 filled in the cavities formed by laterally recessing the cladding layer 222 may be exposed in the S/D recesses 246. Similarly, a portion of the gate spacer 242 previously covered by the S/D features 252 may also be exposed again in the S/D recesses 246 after the S/D reshape process. Also as depicted in FIG. 14C, the selective etching process may form a seam of high aspect ratio between the S/D features 252 and the dielectric fin 228 by etching edge portion of the S/D features 252. The seam may connect the void 254 to external space above the S/D features 252. When the etchant applied in the selective etching process leaks into the void 254, the facet of the bottom surface of the first epitaxial-grown doped layer 252a may also be etched. Referring to FIG. 14D, the partial removal of the third epitaxial-grown doped layer 252c may expose the first and second epitaxial-grown doped layers 252a and 252b in the S/D recesses 246.

Figures 15A, 15B:
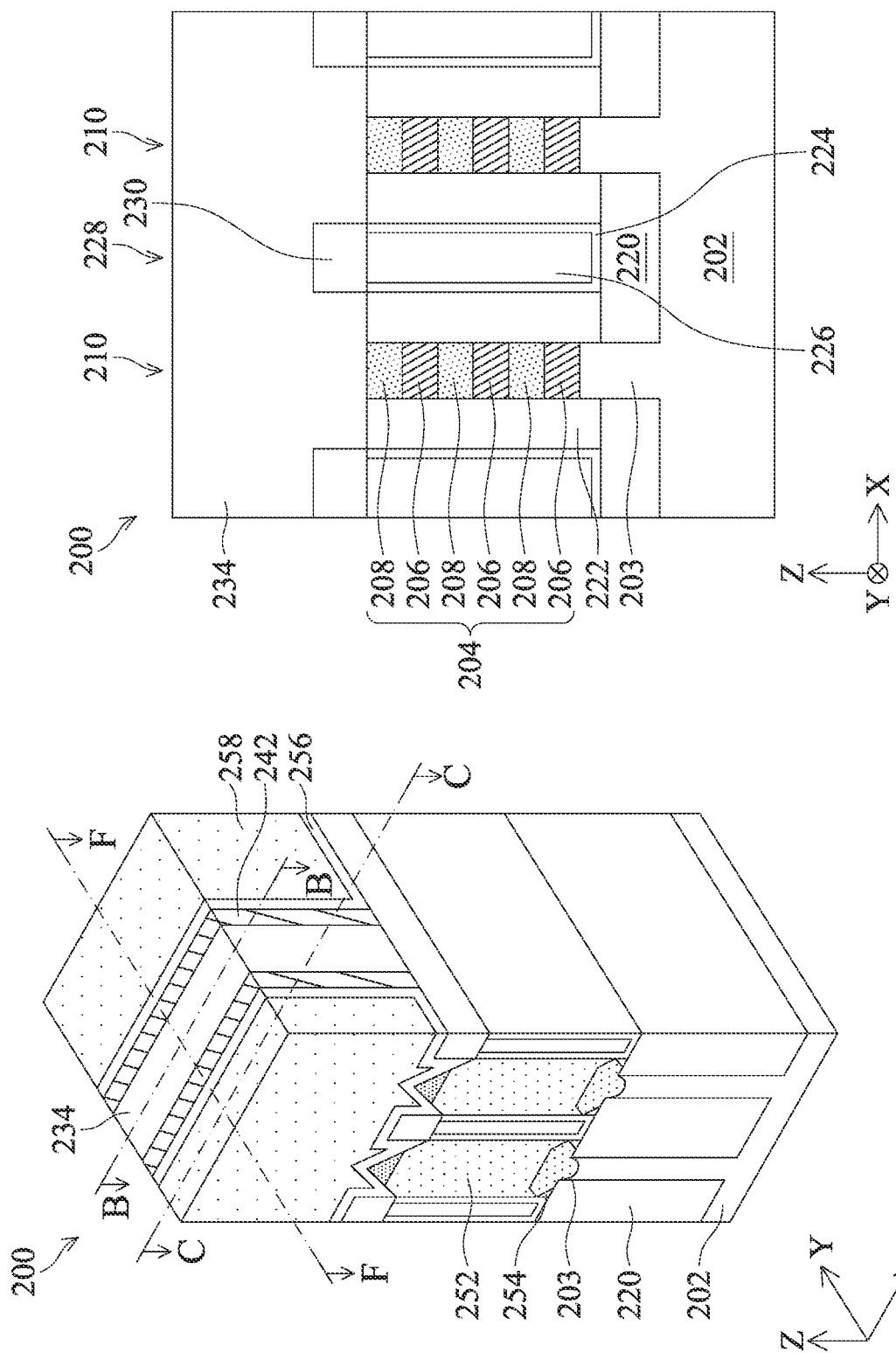
Figures 16A, 16B:
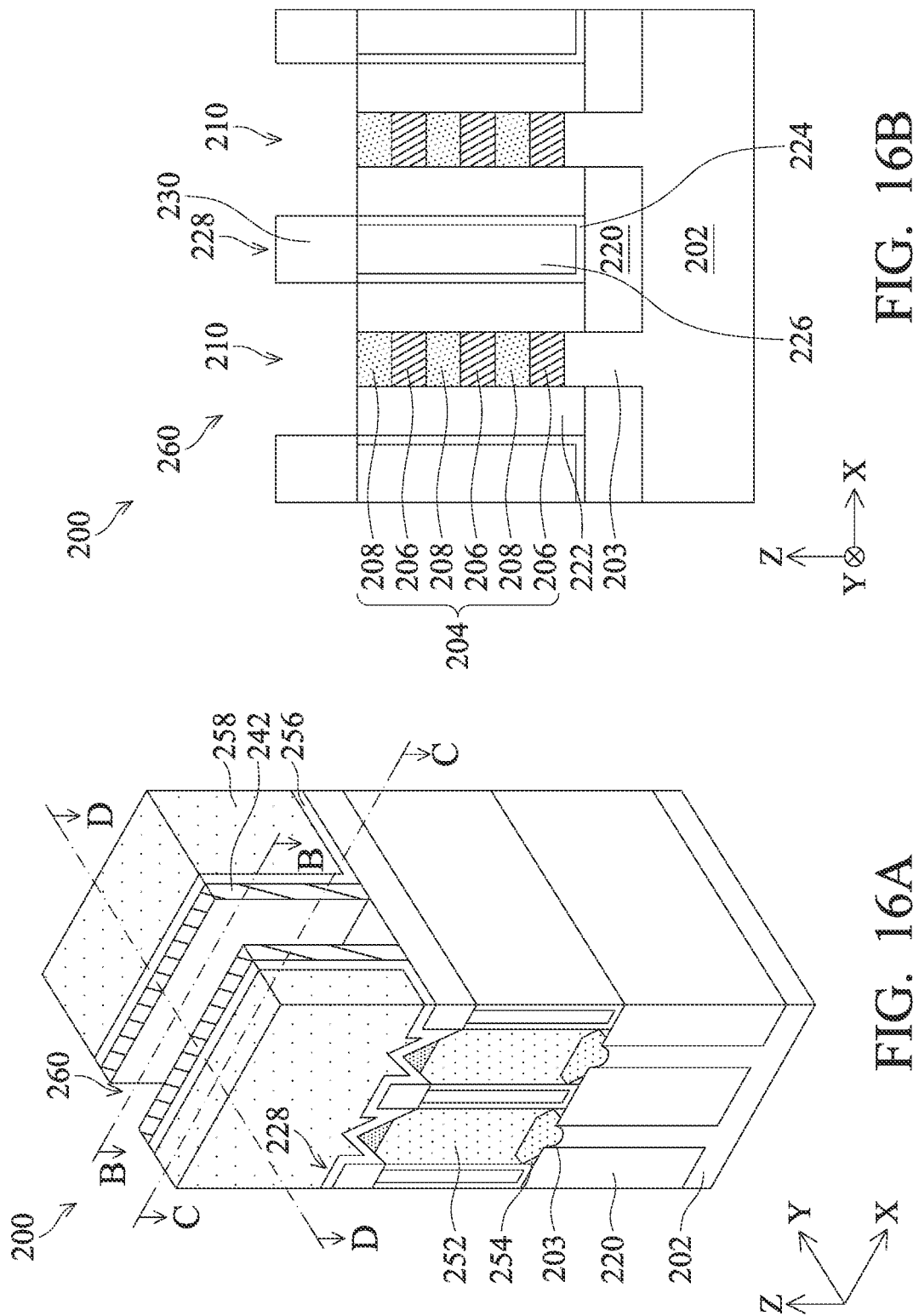
Figure 17B:
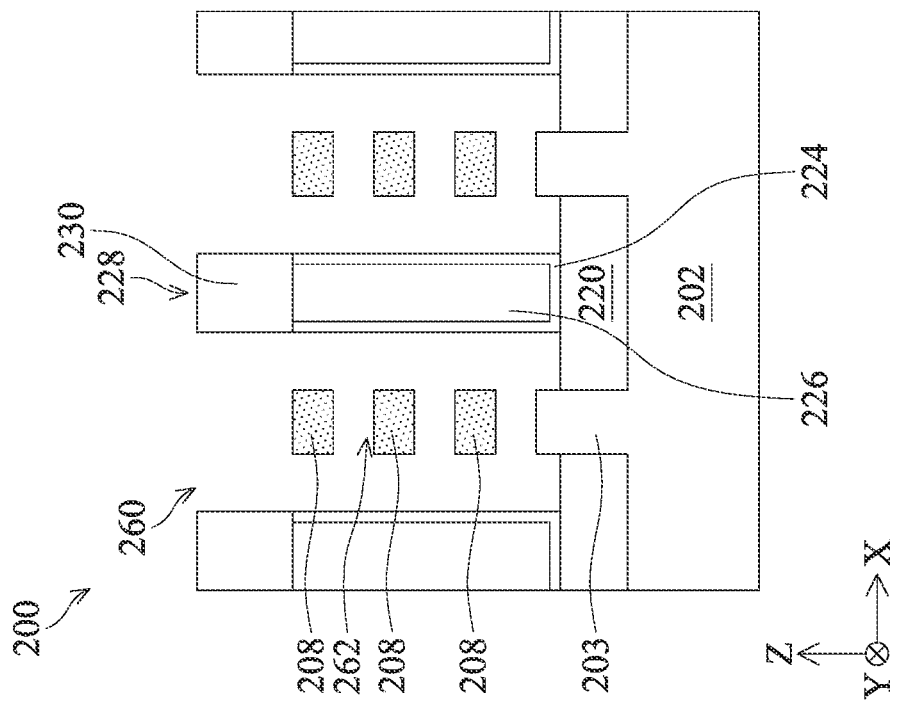
Figure 17A:
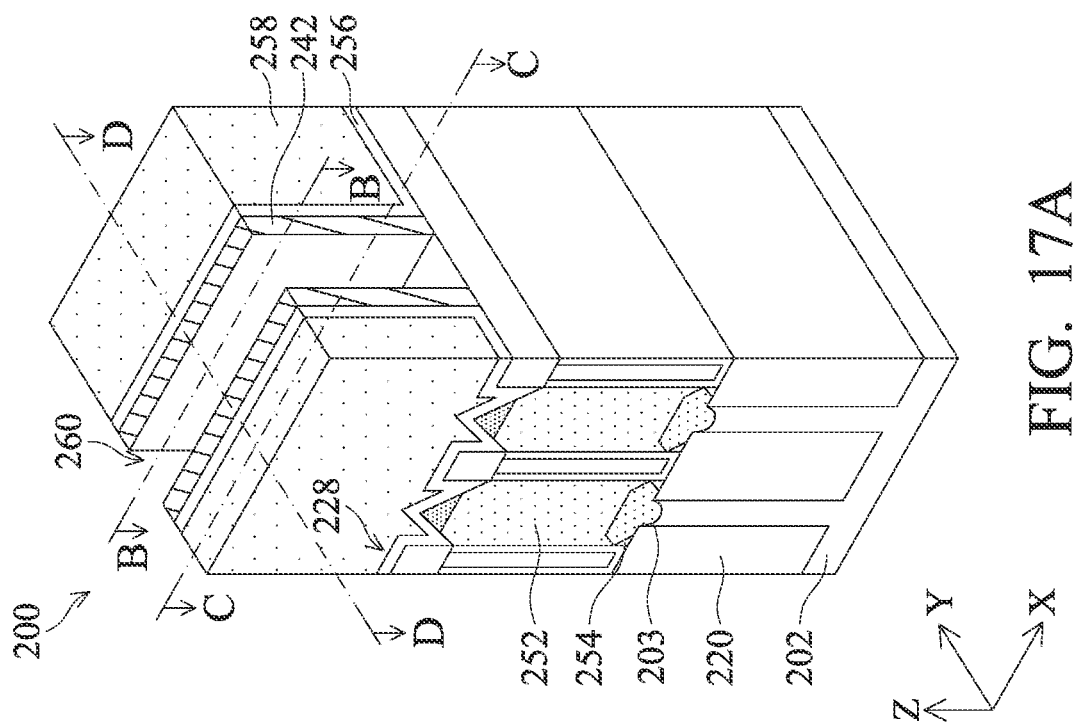

At operation 128, the method 100 (FIG. 1B) forms a contact etch stop layer (CESL) and an inter-layer dielectric (ILD) layer. With reference to FIGS. 15A-15D, a CESL 256 is deposited over the S/D features 252 and the gate spacers 242, and an ILD layer 258 is deposited over the CESL 256. In some embodiments of operation 128, the CESL 256 includes a silicon nitride layer, silicon oxide layer, a silicon oxynitride layer, and/or other materials known in the art. The CESL 256 may be formed by plasma-enhanced chemical vapor deposition (PECVD) process and/or other suitable deposition or oxidation processes. In some embodiments, the ILD layer 258 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 258 may be deposited by a PECVD process or other suitable deposition technique. In some embodiments, after formation of the ILD layer 258, the semiconductor device 200 may be subject to a high thermal budget process to anneal the ILD layer. As discussed, the reshaped S/D features 252 may expose a portion of the topmost channel layer. In such a configuration, the CESL 256 is in contact with and covers the exposed portion of the topmost channel layer, such as illustrated in FIG. 15C. Further, as discussed, the reshaped S/D features 252 may expose a top portion of the sidewalls of the inner spacer 250 in the cavities formed by laterally recessing of the cladding layer 222 at operation 120. In such a configuration, the CESL 256 and the ILD layer 258 are in contact with and cover the exposed portion of the inner spacer 250.

In some examples, after depositing the ILD layer, a planarization process may be performed to remove excessive dielectric materials. For example, a planarization process includes a chemical mechanical planarization (CMP) process which removes portions of the ILD layer 258 (and CESL 256, if present) overlying the dummy gate structure 234 and planarizes a top surface of the semiconductor device 200. In some embodiments, the CMP process also removes the hard mask 236 and exposes the dummy electrode layer of the dummy gate structure 234.

At operation 130, the method 100 (FIG. 1B) removes the dummy gate structure 234 to form a gate trench 260. With reference to FIGS. 16A-16D, the dummy gate structure 234 is removed to expose top surfaces of the dielectric fins 228, the semiconductor fins 210, and the cladding layer 222 in the gate trench 260. Sidewalls of the high-k dielectric layer 230 of the dielectric fins 228 are exposed in the gate trench 260 as well. Operation 130 may include one or more etching processes that are selective to the material in the dummy gate structure 234. For example, recessing the dummy gate structure 234 may be performed using a selective etch process such as a selective wet etch, a selective dry etch, or a combination thereof. A final gate structure (e.g., a high-k metal gate stack) may be subsequently formed in the gate trench 260, as will be described below.

At operation 132, the method 100 (FIG. 1B) removes the epitaxial layers 206 from the semiconductor fins 210 and the cladding layer 222 from the gate trench 260. The resultant structure is shown in FIGS. 17A-17D. In an embodiment, the epitaxial layers 206 and the cladding layer 222 both include SiGe and the epitaxial layers 208 are silicon, allowing for the selective removal of the epitaxial layers 206 and the cladding layer 222. In an embodiment, the epitaxial layers 206 and the cladding layer 222 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. It is noted that during the interim processing stage of operation 138, gaps 262 are provided between the adjacent channel members (e.g., nanowires or nanosheet) in the channel region (e.g., gaps 262 between epitaxial layers 208). The gaps 262 may be filled with ambient environment conditions (e.g., air, nitrogen).

The method 100 then proceeds to operation 134 (FIG. 1B) where a gate structure is formed. The gate structure may be the gate of one or more multi-gate transistors. The gate structure may be a high-k metal gate (HK MG) stack, however other compositions are possible. In some embodiments, the gate structure forms the gate associated with the multi-channels provided by the plurality of channel members (e.g., nanosheets or nanowires having gaps therebetween) in the channel region. The resultant structure is shown in FIGS. 18A-18D. In an embodiment of operation 138, a HK MG stack 270 is formed within the gate trench 260 of the device 200 provided by the release of the epitaxial layers 208, described above with reference to prior operation 132. In various embodiments, the HK MG stack 270 includes an interfacial layer (not shown), a high-K gate dielectric layer 272 formed over the interfacial layer, and a gate electrode layer 274 formed over the high-k gate dielectric layer 272. High-k gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the semiconductor device 200.

Interposing the HK MG stack 270 and the S/D features 252 are the inner spacers 250, providing isolation. The structure of the HK MG stack 270, the S/D features 252, and the inner spacers 250 therebetween forms a parasitic capacitor. Without the S/D reshape process, the S/D features 252 may fully cover the inner spacers 250 (including portions replacing the cladding layer 222) and the effective surface area of the parasitic capacitor is relatively large. As a comparison, by reshaping the S/D features 252, a top portion of the inner spacers (particularly the portions replacing the cladding layer 222) is covered by the CESL 256 and the ILD 258 instead and the effective surface area of the parasitic capacitor is reduced. Consequently, the amount of parasitic capacitance is reduced.

The HK MG stack 270 includes portions that interpose each of the epitaxial layers (channel members) 208, which form channels of the multi-gate device 200. In some embodiments, the interfacial layer of the HK MG stack 270 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k gate dielectric layer 272 of the HK MG stack 270 may include a high-K dielectric such as hafnium oxide ($HfO_2$). Alternatively, the high-k gate dielectric layer 272 of the HK MG stack 270 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-k gate dielectric layer 272 may be formed by ALD, physical vapor deposition (PVD), CVD, oxidation, and/or other suitable methods. As illustrated in FIGS. 18B and 18D, in some embodiments, the high-k gate dielectric layer 272 is deposited conformally on sidewalls of the dielectric fin 228, the inner spacers 250, and top surfaces of the STI features 220.

The gate electrode layer 274 of the HK MG stack 270 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 274 of HK MG stack 270 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer 274 of the HK MG stack 270 may be formed by ALD, PVD, CVD, e-beam evaporation, or other suitable process. Further, the gate electrode layer 274 may be formed separately for N-FET and P-FET transistors which may use different metal layers (e.g., for providing an N-type or P-type work function).

Referring to FIG. 18C, in the illustrated embodiment, the HK MG stack 270 may be etched back so that the top surface of the HK MG stack 270 is lower than the top surfaces of the dielectric fins 228, for example, about 2 nm to about 10 nm lower. The dielectric fins 228 on both sides of each HK MG stack 270 function as gate isolation features that isolate the HK MG stack 270 from other adjacent gate stacks. The portion of the etched-back HK MG stack 270 above the top epitaxial layer 208 may have a thickness ranging from about 10 nm to about 20 nm. After the etching back of the HK MG stack 270, a self-aligned cap (SAC) layer 278 is deposited over the device 200 by CVD, PECVD, or a suitable deposition process. The SAC layer 278 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In various embodiments, a CMP process may be performed to remove excessive metal from the SAC layer 278, and thereby provide a substantially planar top surface of the device 200.

Optionally, the middle dielectric fin 228 may be recessed (for example, by removing the high-k dielectric layer 230), such as after the gate trench 260 is formed and prior to the deposition of the HK MG stack 270, allowing the HK MG stack 270 to straddle the middle dielectric fin 228 and engages two stacks (or more) of channel members 208 on both sides of the middle dielectric fin 228. The alternative resultant structure is shown in FIG. 19, which is a cross-sectional view taken in the X-Z plane along the B-B line in FIG. 18A. In such a configuration, the two transistors share the same gate stack. The HK MG stack 270 is also referred to as a joint gate stack.

The device 200 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. In furtherance of the example, a multi-layer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

One of ordinary skill may recognize although FIGS. 2A-19 illustrate GAA devices as embodiments, other examples of semiconductor devices may benefit from aspects of the present disclosure, such as FinFET devices. Referring to FIGS. 20A-20D, in FinFET devices, the semiconductor fins 210 provide channel regions for the transistors other than the vertically stacked channel members as in GAA devices. Similarly, the reshaped S/D features 252 reduces parasitic capacitance and leakage in FinFET devices.

Although not intended to be limiting, one or more embodiments of the present disclosure provide many benefits to a semiconductor device and the formation thereof. For example, embodiments of the present disclosure provide dielectric fins for improving fin uniformity and defining space for source/drain (S/D) features, and sacrificial cladding layers for reserving space for metal gate stacks. The sacrificial cladding layer increases spacing between adjacent dielectric fins and may lead to larger volume of S/D epitaxial features. An S/D reshape process modifies the shape of S/D epitaxial features, which reduces volume of S/D epitaxial features and consequently parasitic capacitance between S/D contacts and metal gate stacks. The leakage between S/D contacts and metal gate stacks is also suppressed. Furthermore, the S/D reshape process can be easily integrated into existing semiconductor fabrication processes.

In one exemplary aspect, the present disclosure is directed to a method. The method includes forming a semiconductor fin protruding from a substrate, forming a dummy gate structure across the semiconductor fin, recessing a portion of the semiconductor fin in a region adjacent the dummy gate structure, thereby forming a recess, growing a semiconductor layer in the recess, forming a first dielectric layer interposing the semiconductor layer and the dummy gate structure, the semiconductor layer covering at least a portion of the first dielectric layer, modifying a shape of the semiconductor layer, such that the portion of the first dielectric layer is exposed, depositing a second dielectric layer covering the semiconductor layer and the portion of the first dielectric layer, and replacing the dummy gate structure with a metal gate structure. In some embodiments, the modifying of the shape of the semiconductor layer recesses a top surface of the semiconductor layer. In some embodiments, the recessed top surface of the semiconductor layer exposes a top portion of the semiconductor fin in the recess. In some embodiments, after the modifying of the shape of the semiconductor layer, a top surface of the semiconductor layer includes a convex portion sandwiched by two shoulder portions. In some embodiments, the convex portion includes crystalline facets. In some embodiments, the convex portion has an arc-shape. In some embodiments, the two shoulder portions are of different heights. In some embodiments, the growing of the semiconductor layer includes growing an epitaxial layer in the recess, and growing a semiconductor capping layer covering the epitaxial layer. In some embodiments, the modifying of the shape of the semiconductor layer partially removes the semiconductor capping layer and exposes the epitaxial layer. In some embodiments, the forming of the first dielectric layer includes forming a cladding layer on sidewalls of the semiconductor fin, laterally recessing a portion of the semiconductor fin and the cladding layer, thereby forming a cavity, and filling the cavity with a dielectric material.

In another exemplary aspect, the present disclosure is directed to a method. The method includes forming a semiconductor fin protruding from a substrate, forming a cladding layer on sidewalls of the semiconductor fin, forming first and second dielectric fins on sidewalls of the cladding layer, forming a dummy gate structure on the semiconductor fin and the first and second dielectric fins, recessing the semiconductor fin in a region adjacent to the dummy gate structure, thereby forming a recess, laterally recessing the cladding layer and a portion of the semiconductor fin exposed in the recess, thereby forming a cavity, depositing an isolation layer in the cavity; growing an epitaxial feature in the recess and sandwiched by the first and second dielectric fins, the epitaxial feature covering a sidewall of the isolation layer, reshaping the epitaxial feature, thereby exposing a top portion of the sidewall of the isolation layer, depositing a dielectric layer over the epitaxial feature and the top portion of the sidewall of the isolation layer, and replacing the dummy gate structure with a metal gate structure. In some embodiments, the semiconductor fin includes channel layers and sacrificial layers alternatingly disposed in a vertical direction, and the laterally recessing of the portion of the semiconductor fin includes etching end portions of the sacrificial layers. In some embodiments, the reshaping of the epitaxial feature also exposes a portion of a topmost channel layer. In some embodiments, the reshaping of the epitaxial feature reduces a volume of the epitaxial feature. In some embodiments, the reshaping of the epitaxial feature modifies a top surface of the epitaxial feature, such that the modified top surface of the epitaxial feature includes a convex portion sandwiched by two flat portions. In some embodiments, the convex portion includes a vertex below top surfaces of the first and second dielectric fins.

In yet another exemplary aspect, the present disclosure is directed to a multi-gate semiconductor device. The multi-gate semiconductor device includes channel members vertically stacked above a substrate, a conductive structure wrapping around each of the channel members, an epitaxial feature abutting the channel members, a top surface of the epitaxial feature including two step profiles sandwiching an upward protruding portion, an isolation layer interposing the epitaxial feature and the conductive structure, and a dielectric layer covering the epitaxial feature. In some embodiments, the dielectric layer is in contact with a top portion of the isolation layer. In some embodiments, the upward protruding portion of the epitaxial feature includes a crystalline facet. In some embodiments, the semiconductor device further includes first and second dielectric pillars sandwiching the channel members and the epitaxial feature, a topmost portion of the epitaxial feature being below a top surface of one of the first and second dielectric pillars.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
   forming a semiconductor fin protruding from a substrate;
   forming a dummy gate structure across the semiconductor fin;
   recessing a portion of the semiconductor fin in a region adjacent the dummy gate structure, thereby forming a recess;
   growing a semiconductor layer in the recess;
   forming a first dielectric layer interposing the semiconductor layer and the dummy gate structure, wherein the semiconductor layer covers at least a portion of the first dielectric layer;
   modifying a shape of the semiconductor layer, such that the portion of the first dielectric layer is exposed;

depositing a second dielectric layer covering and interfacing both the semiconductor layer and the portion of the first dielectric layer; and replacing the dummy gate structure with a metal gate structure, wherein the first dielectric layer laterally interposes the semiconductor layer and the metal gate structure along a lengthwise direction of the semiconductor fin.

2. The method of claim 1, wherein the modifying of the shape of the semiconductor layer recesses a top surface of the semiconductor layer.

3. The method of claim 1, wherein after the modifying of the shape of the semiconductor layer, a top surface of the semiconductor layer includes a convex portion sandwiched by two shoulder portions.

4. The method of claim 3, wherein the convex portion includes crystalline facets.

5. The method of claim 3, wherein the convex portion has an arc-shape.

6. The method of claim 3, wherein the two shoulder portions are of different heights.

7. The method of claim 1, wherein the growing of the semiconductor layer includes:
growing an epitaxial layer in the recess, and
growing a semiconductor capping layer covering the epitaxial layer.

8. The method of claim 7, wherein the modifying of the shape of the semiconductor layer partially removes the semiconductor capping layer and exposes the epitaxial layer.

9. The method of claim 1, wherein the forming of the first dielectric layer includes:
forming a cladding layer on sidewalls of the semiconductor fin,
laterally recessing a portion of the semiconductor fin and the cladding layer, thereby forming a cavity, and
filling the cavity with a dielectric material.

10. The method of claim 1, wherein the first dielectric layer separates the semiconductor layer from interfacing the metal gate structure.

11. A method, comprising:
forming a semiconductor fin protruding from a substrate;
forming a cladding layer on sidewalls of the semiconductor fin;
forming first and second dielectric fins on sidewalls of the cladding layer;
forming a dummy gate structure on the semiconductor fin and the first and second dielectric fins;
recessing the semiconductor fin in a region adjacent to the dummy gate structure, thereby forming a recess;
laterally recessing the cladding layer and a portion of the semiconductor fin exposed in the recess, thereby forming a cavity;
depositing an isolation layer in the cavity;
growing an epitaxial feature in the recess and sandwiched by the first and second dielectric fins, wherein the epitaxial feature covers a sidewall of the isolation layer;
reshaping the epitaxial feature, thereby exposing a top portion of the sidewall of the isolation layer;
depositing a dielectric layer over the epitaxial feature and the top portion of the sidewall of the isolation layer; and
replacing the dummy gate structure with a metal gate structure.

12. The method of claim 11, wherein the semiconductor fin includes channel layers and sacrificial layers alternatingly disposed in a vertical direction, and wherein the laterally recessing of the portion of the semiconductor fin includes etching end portions of the sacrificial layers.

13. The method of claim 12, wherein the reshaping of the epitaxial feature also exposes a portion of a topmost channel layer.

14. The method of claim 11, wherein the reshaping of the epitaxial feature reduces a volume of the epitaxial feature.

15. The method of claim 11, wherein the reshaping of the epitaxial feature modifies a top surface of the epitaxial feature, such that the modified top surface of the epitaxial feature includes a convex portion sandwiched by two flat portions.

16. The method of claim 15, wherein the convex portion includes a vertex below top surfaces of the first and second dielectric fins.

17. A method, comprising:
forming a semiconductor fin protruding from a substrate;
forming a dummy gate structure over a channel region of the semiconductor fin;
depositing a gate spacer on a sidewall of the dummy gate structure;
recessing a source/drain region of the semiconductor fin to form a source/drain recess;
growing an epitaxial source/drain feature in the source/drain recess, the epitaxial source/drain feature covering a sidewall of the semiconductor fin previously exposed in the source/drain recess;
modifying a shape of the epitaxial source/drain feature, such that a top portion of the sidewall of the semiconductor fin previously covered by the epitaxial source/drain feature is exposed;
depositing an inter-layer dielectric layer covering the epitaxial source/drain feature and interfacing the top portion of the sidewall of the semiconductor fin;
removing the dummy gate structure to form a gate trench; and
forming a metal gate structure in the gate trench.

18. The method of claim 17, further comprising:
forming a cladding layer sandwiching the semiconductor fin;
recessing the cladding layer to form a cavity directly under the gate spacer; and
depositing a dielectric layer in the cavity,
wherein prior to the modifying of the shape of the epitaxial source/drain feature, a sidewall of the dielectric layer is covered by the epitaxial source/drain feature, and
wherein after the modifying of the shape of the epitaxial source/drain feature, a top portion of the sidewall of the dielectric layer is exposed.

19. The method of claim 17, wherein the semiconductor fin includes a plurality of channel layers interleaved by a plurality of sacrificial layers, the method further comprising:
after the removing of the dummy gate structure, removing the sacrificial layers from the gate trench, wherein the metal gate structure wraps around each of the channel layers.

20. The method of claim 19, wherein after the modifying of the shape of the epitaxial source/drain feature, a sidewall of a topmost one of the channel layers is exposed.

* * * * *